(12) United States Patent
Yamamoto

(10) Patent No.: US 10,341,582 B2
(45) Date of Patent: Jul. 2, 2019

(54) ACTIVE SUBSTRATE AND IMAGING DEVICE

(71) Applicant: SHARP KABUSHIKI KAISHA, Sakai, Osaka (JP)

(72) Inventor: Kaoru Yamamoto, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/090,179

(22) PCT Filed: Mar. 23, 2017

(86) PCT No.: PCT/JP2017/011574
§ 371 (c)(1),
(2) Date: Sep. 28, 2018

(87) PCT Pub. No.: WO2017/170072
PCT Pub. Date: Oct. 5, 2017

(65) Prior Publication Data
US 2019/0116324 A1    Apr. 18, 2019

(30) Foreign Application Priority Data

Mar. 30, 2016 (JP) ................................. 2016-067246

(51) Int. Cl.
*H04N 5/32* (2006.01)
*H04N 5/3745* (2011.01)
*H04N 5/341* (2011.01)
*H01L 27/146* (2006.01)
*H04N 5/378* (2011.01)
*H01L 29/786* (2006.01)
*H04N 5/343* (2011.01)

(52) U.S. Cl.
CPC ......... *H04N 5/32* (2013.01); *H01L 27/14663* (2013.01); *H01L 29/7869* (2013.01); *H04N 5/343* (2013.01); *H04N 5/378* (2013.01); *H04N 5/37455* (2013.01)

(58) Field of Classification Search
CPC ........ H04N 5/3745; H04N 5/32; H04N 5/341; H04N 5/347; H04N 5/378
See application file for complete search history.

(56) References Cited

U.S. PATENT DOCUMENTS 6,627,896 B1 * 9/2003 Hashimoto .............. H04N 5/32
250/370.01
2015/0146852 A1    5/2015 Sung et al.

FOREIGN PATENT DOCUMENTS

JP    2003-198956 A    7/2003
JP    2015-100711 A    6/2015

* cited by examiner

*Primary Examiner* — David P Porta
*Assistant Examiner* — Fani Boosalis
(74) *Attorney, Agent, or Firm* — ScienBiziP, P.C.

(57) ABSTRACT

Provided is an active substrate that is capable of performing high-speed scanning for setting specific scan signal lines to be active at the same time. Each of the shift registers (4) in an N-th stage shift register in two shift register blocks (2 and 3) outputs an out signal in such a manner that neighboring scan signal lines (GLn and GLn+1) are active at the same time.

20 Claims, 23 Drawing Sheets

FIG. 7
(a)
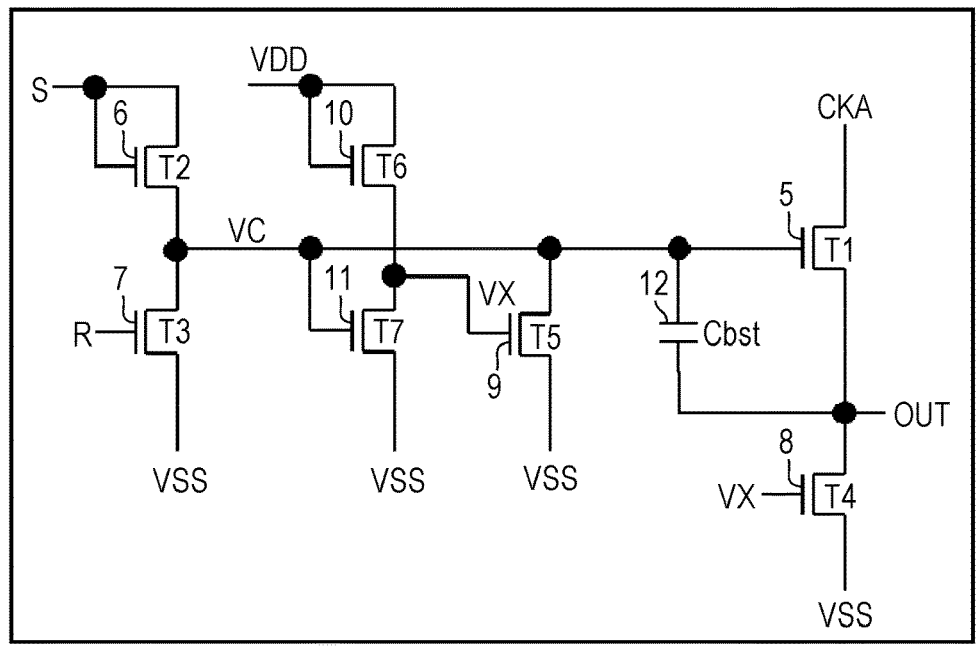
(b)
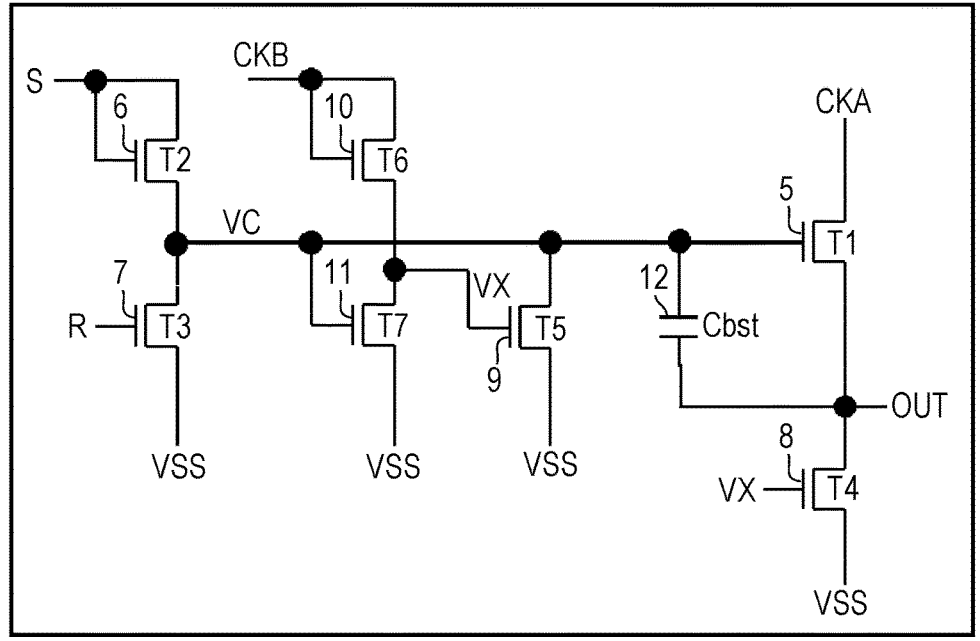

ACTIVE SUBSTRATE AND IMAGING DEVICE

TECHNICAL FIELD

The disclosure relates to an active substrate that results from forming a drive circuit that drives a scan signal line, in a monolithic manner on a substrate and an imaging device that includes the active substrate.

BACKGROUND ART

At present, the most common type of X-ray imaging device is an indirect exchange type. In order to detect an electrical signal that is converted by a scintillator, an active matrix-type TFT array is employed. In the related art, in order to form a thin film transistor element (TFT element) in the TFT array, an a-SI layer is used as a semiconductor layer.

Because of this characteristic of the a-Si layer, the a-Si layer is difficult to use as a semiconductor layer for a drive circuit, such as a gate driver.

Therefore, in the TFT array that includes the a-Si layer, the drive circuit such as the gate driver is formed by being attached from the outside.

In a case where the gate driver is formed in this manner by being attached from the outside, as disclosed in PTL 1 and PTL 2, each scan signal line in the TFT array is partly selected, and thus scanning for setting a High state to be entered (to be active) is possible.

However, in recent years, with a performance improvement resulting from high mobility, a screen-uniformity performance, and the like, a TFT array has been developed that includes an oxide semiconductor layer, for example, an oxide semiconductor layer containing Indium (In), Gallium (Ga), and Zinc (Zn).

In the TFT array that includes the oxide semiconductor layer, gate driver monolithic (hereinafter referred to as CDM), that is, a gate driver, is formed directly on the TFT array, and thus a reduction in the number of components and a reliability improvement are realized.

CITATION LIST

Patent Literature

PTL 1: Japanese Unexamined Patent Application Publication No. 2015-100711 (published on Jun. 4, 2015)
PTL 2: Japanese Unexamined Patent Application Publication No. 2003-198956 (published on Jul. 11, 2003)

SUMMARY

Technical Problem

A problem with the imaging device that includes an active substrate in the related art, in which the gate driver is formed with GDM on the TFT array will be described below with reference to FIGS. 24 and 25.

FIG. 24 is a diagram illustrating a schematic configuration of an imaging device 100 in the related art.

The imaging device 100 includes an active substrate 101 and as external drive circuit 150.

The active substrate 101 includes a gate driver 120 that is formed with GDM, a plurality of data signal lines, data signal lines DL1 to DLm, a plurality of scan signal lines, scan signal lines GL1 to GLn, and a plurality of (m×n) pixel units PIX that are correspondingly provided at points, respectively, at which the plurality of data signal lines, the data signal lines DL1 to DLm, and the plurality of scan signal lines, the scan signal lines GL1 to GLn intersect.

These m×n pixel units PIX constitute a light reception area 110 that is positioned in a matrix form. Included in each pixel unit PIX are a TFT element 114 that is a switching element of which a gate terminal is connected to a scan signal line that passes through a corresponding intersection point and of which a source terminal is connected to a data signal line that passes through an intersection point, and a photodiode 115 that receives light which results from conversion of an X-ray by a scintillator, and converts the light into an electrical signal.

That is, the TFT elements 114, each of which includes a semiconductor layer, and the gate driver 120 that drive the plurality of scan signal lines, the scan signal lines GL1 to GLn, that are connected to the TFT elements 114, respectively, are formed on the same substrate.

It is noted that a shift register circuit 121 is included in the gate driver 120 which is formed with GDM.

Furthermore, an external drive circuit 150 includes a gate signal drive circuit 160 and a data signal drive circuit (a reading circuit) 170.

The gate signal drive circuit 160 controls the gate driver 120 with various control signals via a gate signal terminal 140 that is included in the active substrate 101.

The data signal drive circuit (the reading circuit) 170 performs reading of a signal from the active substrate 101 at a prescribed timing via a data signal reading terminal 130 that is included in the active substrate 101.

(a) of FIG. 25 is a diagram illustrating a method of scanning the scan signal lines GL1 to GLn, which can be performed using the gate driver 120 that is included in the imaging device 100 in the related art. (b) of FIG. 25 is a diagram illustrating a schematic configuration of the shift register circuit 121 that is included in the gate driver 120. (c) of FIG. 25 is a diagram illustrating a signal that is input into the shift register circuit 121 and a signal that is output from the shift register circuit 121.

As illustrated in (b) of FIG. 25, the shift register circuit 121 that is included in the gate driver 120 is made from a single shift register block that is configured with shift registers 122a, 122b, 122c, 122d, and so forth which are controlled with a clock signal CK1 and a clock signal CK2.

Because the shift register circuit 121 that is included in the gate driver 120 is configured in this manner, as illustrated in (c) of FIG. 25, the scan signal lines GL1 to GLn are sequentially selected to enter the High state (to be active). Furthermore, as illustrated in (a) of FIG. 25, in the imaging device 100 in the related art, only normal scanning for sequentially setting the scan signal lines GL1 to GLn to be in the High state (to be active) through selection can be performed, and it is difficult to selectively set only a scan signal line to be in the High state (to be active), to set specific scan signal lines to be in the High state (to be active) at the same time, and so forth.

An object of the present disclosure, which was made in view of the problems described above, is to provide an active substrate that is capable of performing high-speed scanning for setting specific scan signal lines to be active at the same time in the case of an active substrate that results from forming on the same substrate a plurality of switching elements each of which includes a semiconductor layer, and a drive circuit that drives a plurality of scan signal lines that are connected to the switching elements, respectively.

Solution to Problem

In order to deal with the problems described above, according to an aspect of the present disclosure, there is provided an active substrate that results from forming on the same substrate a plurality of switching elements each of which includes a semiconductor layer, and a drive circuit that drives a plurality of scan signal lines that are connected to the switching elements, respectively, in which the drive circuit includes N (N is equal to or greater than 2) shift register blocks in each of which a plurality of stage-wise shift registers, each of which outputs an output signal to one of the plurality of scan signal lines, are included, in which N shift registers in the same stage in the N shift register blocks are connected to N neighboring scan signal lines, respectively, and in which N shift registers that belong to each of at least one or more same stages, among a plurality of same stages in the N shift register blocks, output output signals in such a manner that two or more neighboring scan signal lines, among the N neighboring scan signal lines, are active at the same time.

With the configuration described above, in the drive circuit, the N shift registers that belong to each of the at least one or more same stages, among the plurality of same stages, in the N shift register blocks, output the output signals in such a manner that, among the N neighboring scan signal lines, two or more scan signal lines are active at the same time. Because of this, in the case of the active substrate that results from forming on the same substrate the plurality of switching elements each of which includes the semiconductor layer, and the drive circuit that drives the plurality of scan signal lines that are connected to the switching elements, respectively, the active substrate that is capable of performing high-speed scanning for setting specific scan signal lines to be active at the same time can also be realized.

Advantageous Effects of Invention

According to an aspect of the present disclosure, an active substrate can be provided that is capable of performing high-speed scanning for setting specific scan signal lines to be active at the same time in the case of the active substrate that results from forming on the same substrate a plurality of switching elements each of which includes a semiconductor layer, and a drive circuit that drives a plurality of scan signal lines that are connected to the switching elements, respectively.

Figure 4:
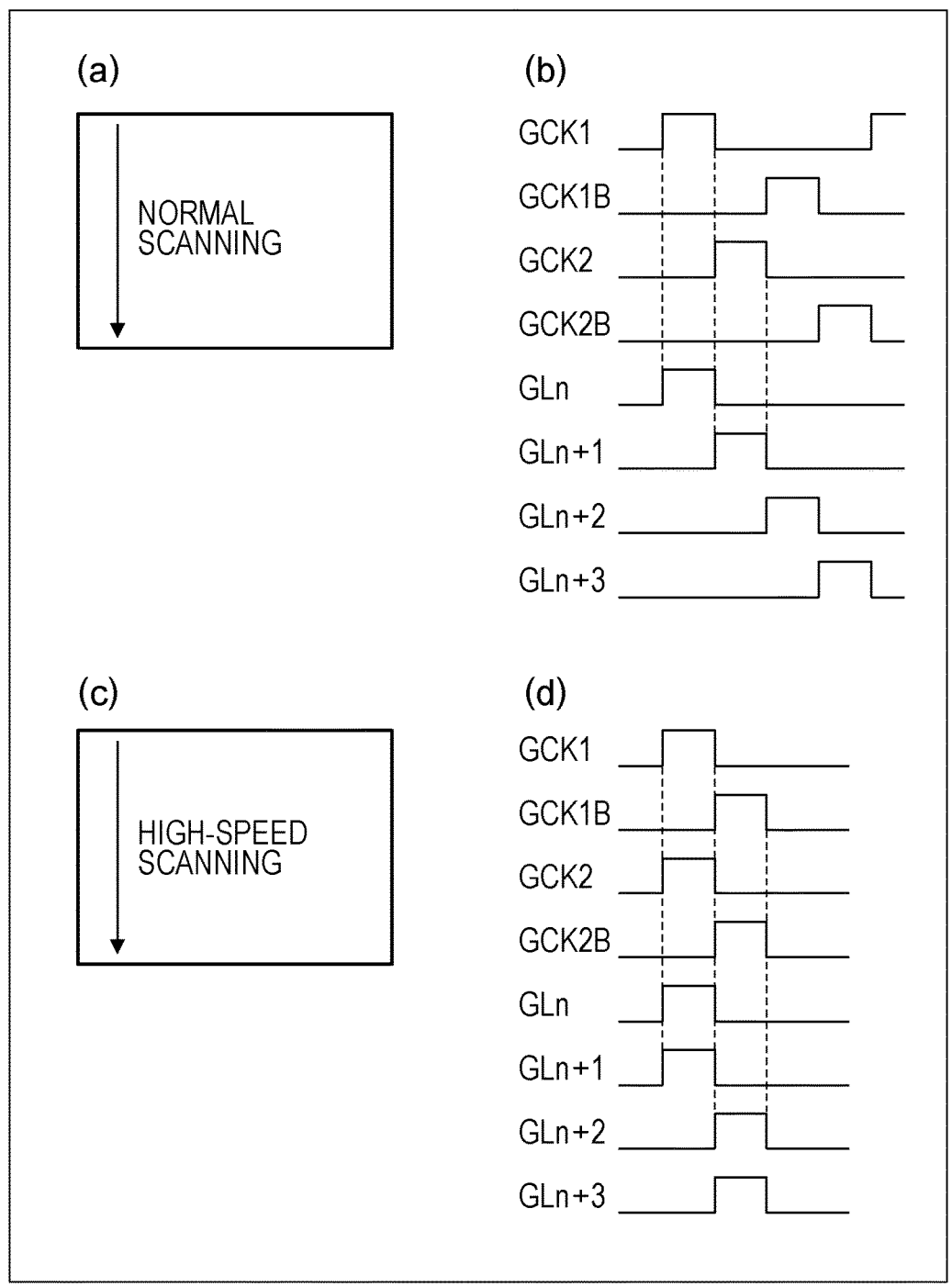

(a) of FIG. 4 is a diagram illustrating an example of a clock signal that is used in a case of performing normal scanning for sequentially setting scan signal lines to be active in an imaging device that includes the active substrate. (b) of FIG. 4 is a diagram illustrating an example of a clock signal that is used in a case of performing high-speed scanning for setting the scan signal lines to be active at the same time in the imaging device that includes the active substrate.

Figure 5:
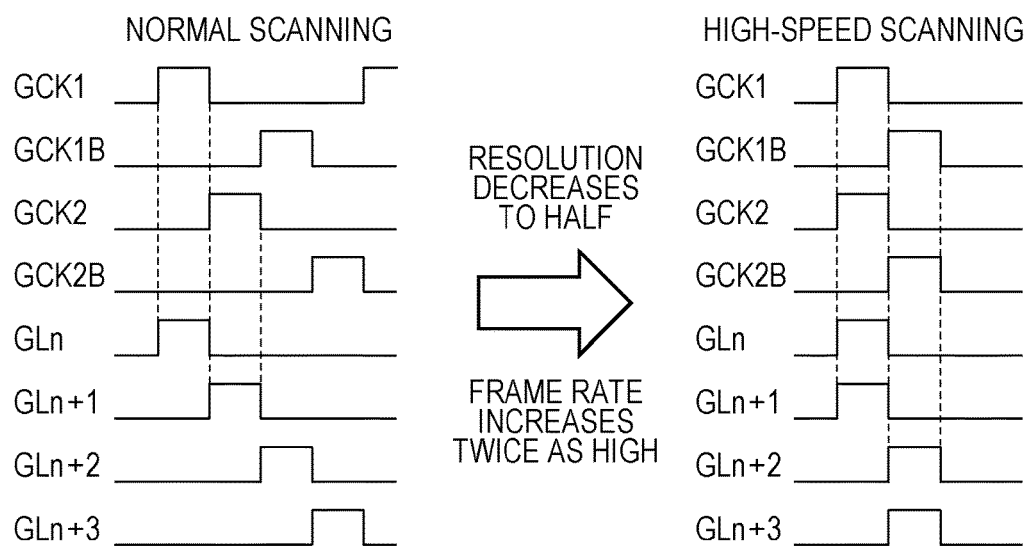

FIG. 5 is a diagram for describing a change in resolution and a change in a frame rate in a case where, in an imaging device that includes the active substrate, a gate driver is driven by normal scanning and high-speed scanning and a data signal drive circuit performs reading of all pixel units PIX.

Figure 6:
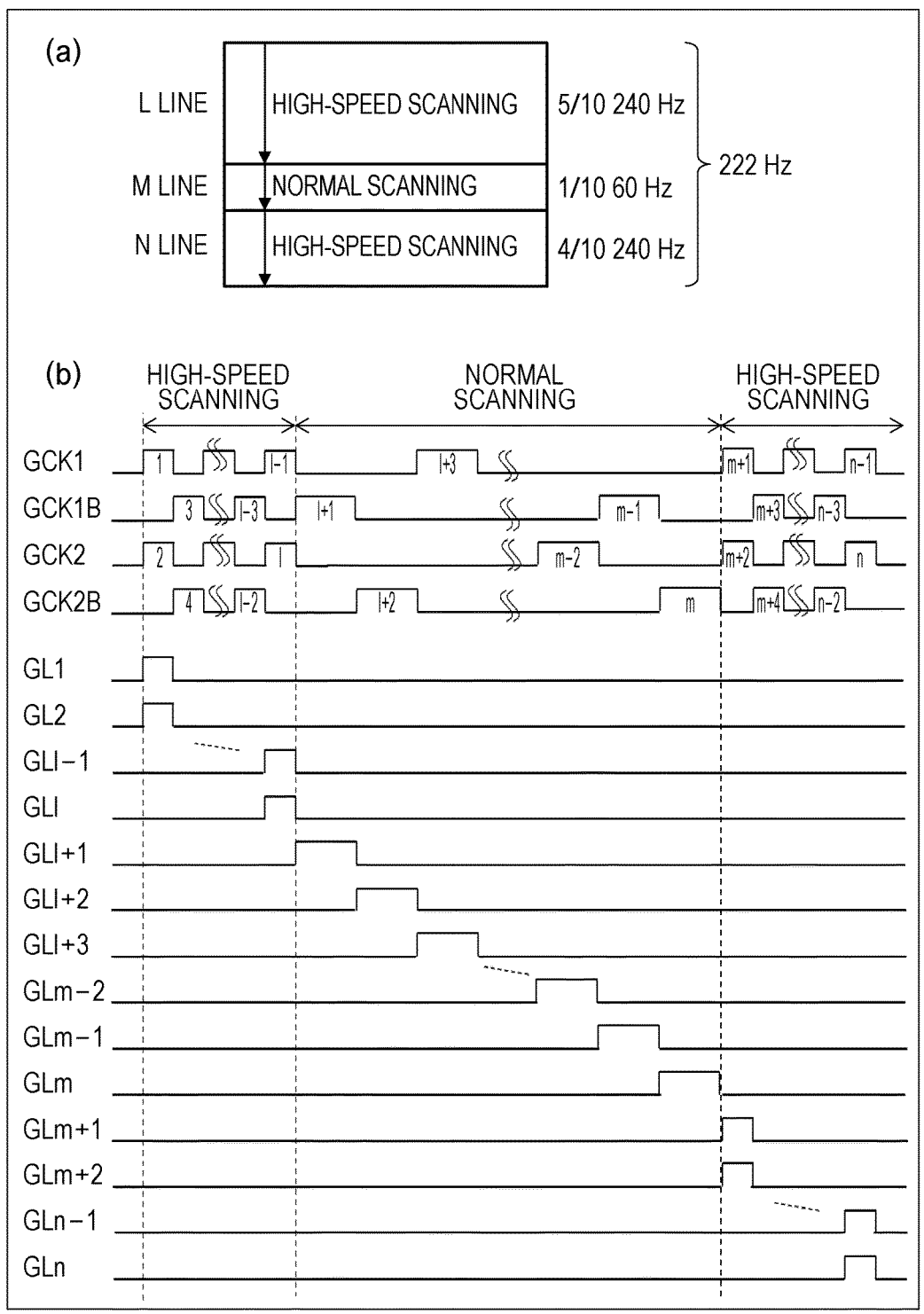

FIG. 6 is a diagram for describing a case where switching between the normal scanning and the high-speed scanning takes place during a 1V duration (a first vertical duration) in the imaging device that includes the active substrate.

FIG. 7 is a diagram illustrating schematic configurations of shift registers, each of which has a pull-down circuit or a capacity.

Figure 8:
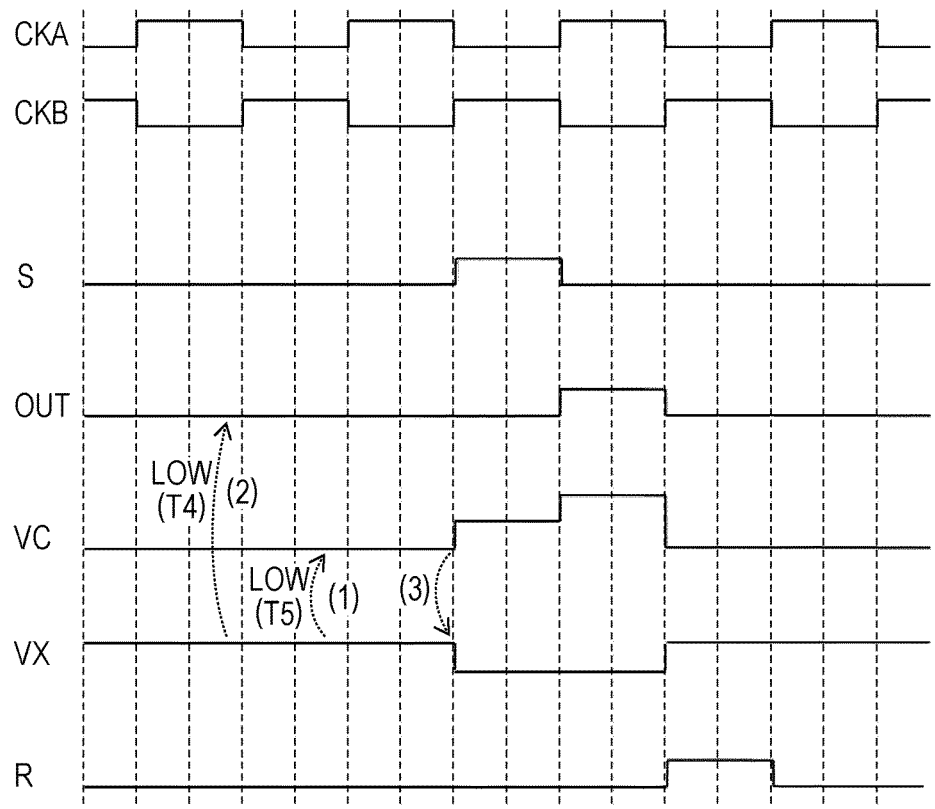

FIG. 8 is a diagram illustrating an example of a drive timing chart for the shift register that includes a CK pull-down circuit.

Figure 9:
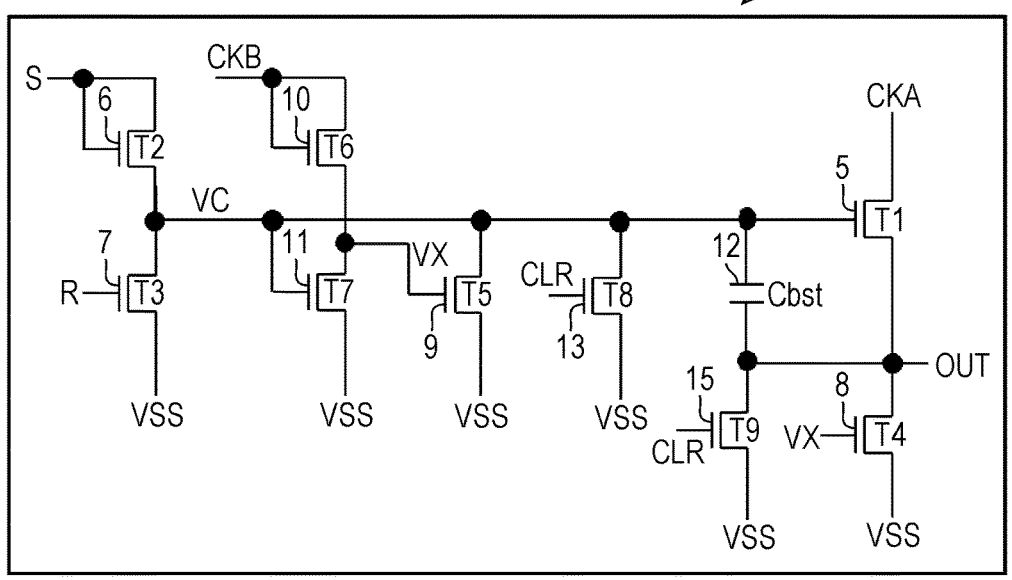

FIG. 9 is a diagram illustrating a schematic configuration of the shift register, in which an output node that includes a scan signal line which is connected to a VC node and the shift register is pulled down based on a CLR signal.

Figure 10:
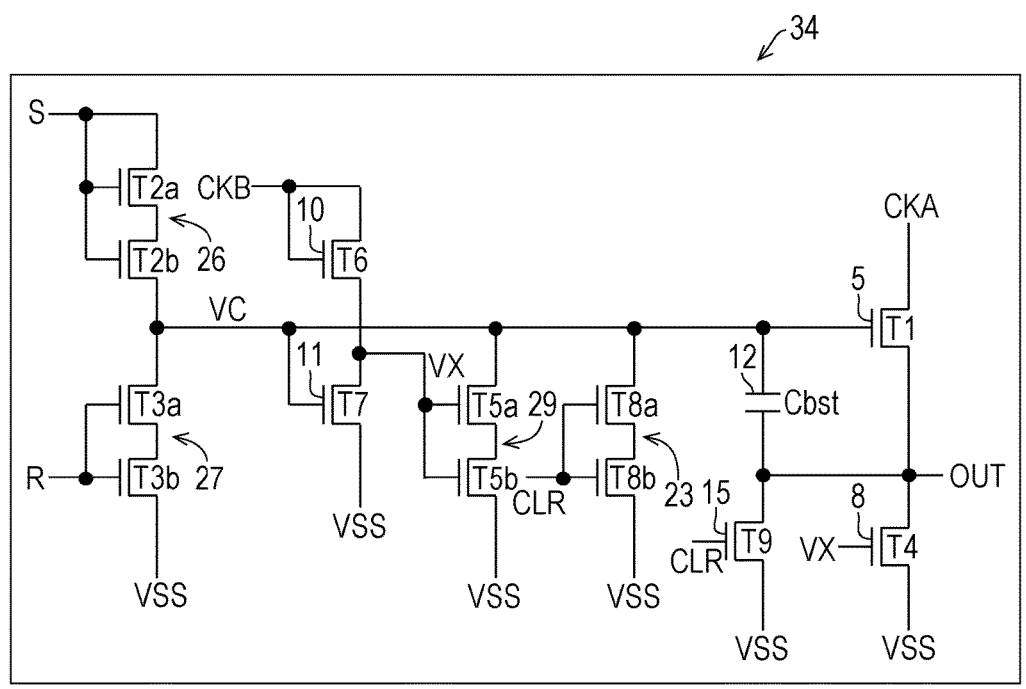

FIG. 10 is a diagram illustrating a schematic configuration of the shift register, one or several transistors of which are transistors each of which has a dual-gate structure.

Figure 11:
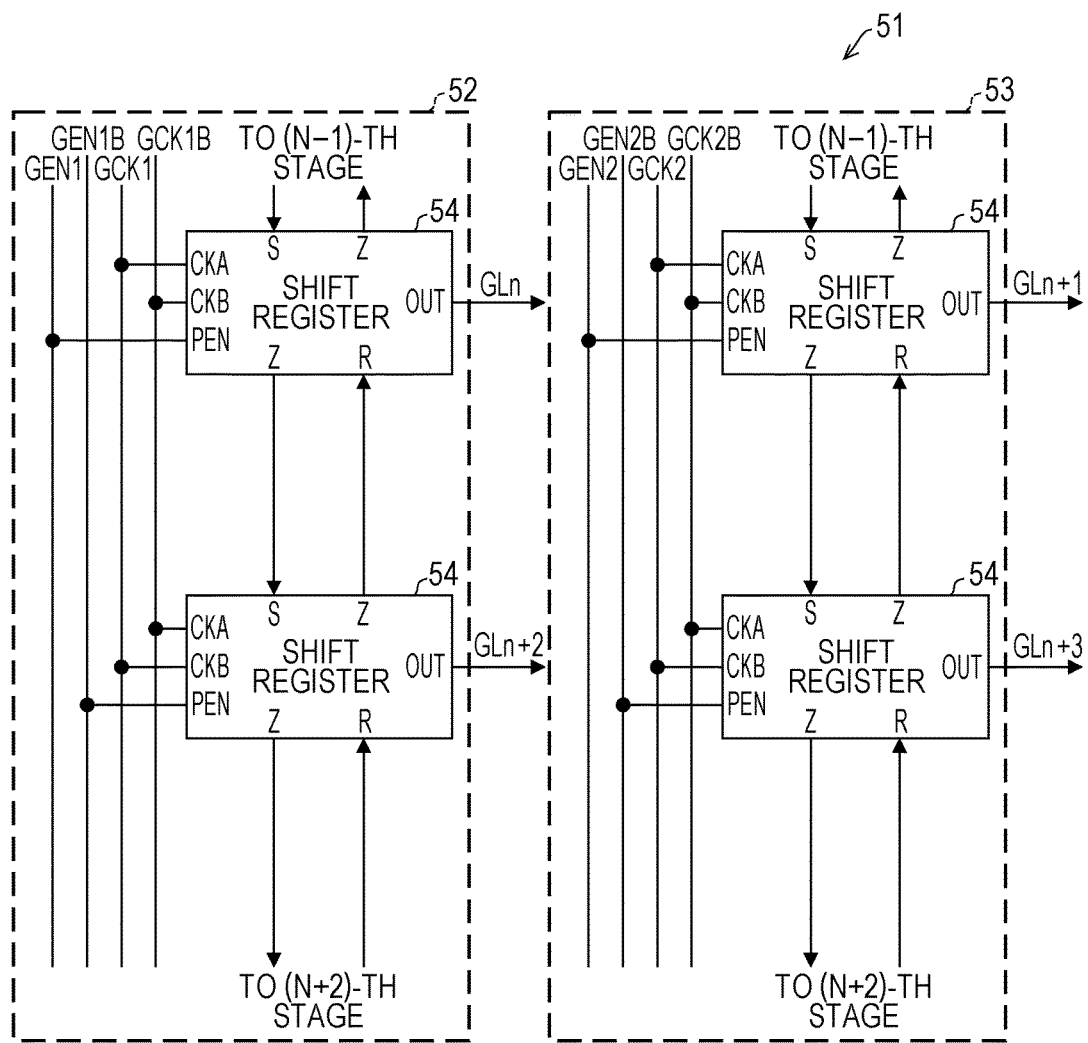

FIG. 11 is a diagram illustrating a schematic configuration of the shift register circuit that is included in the gate driver on the active substrate.

Figure 12:
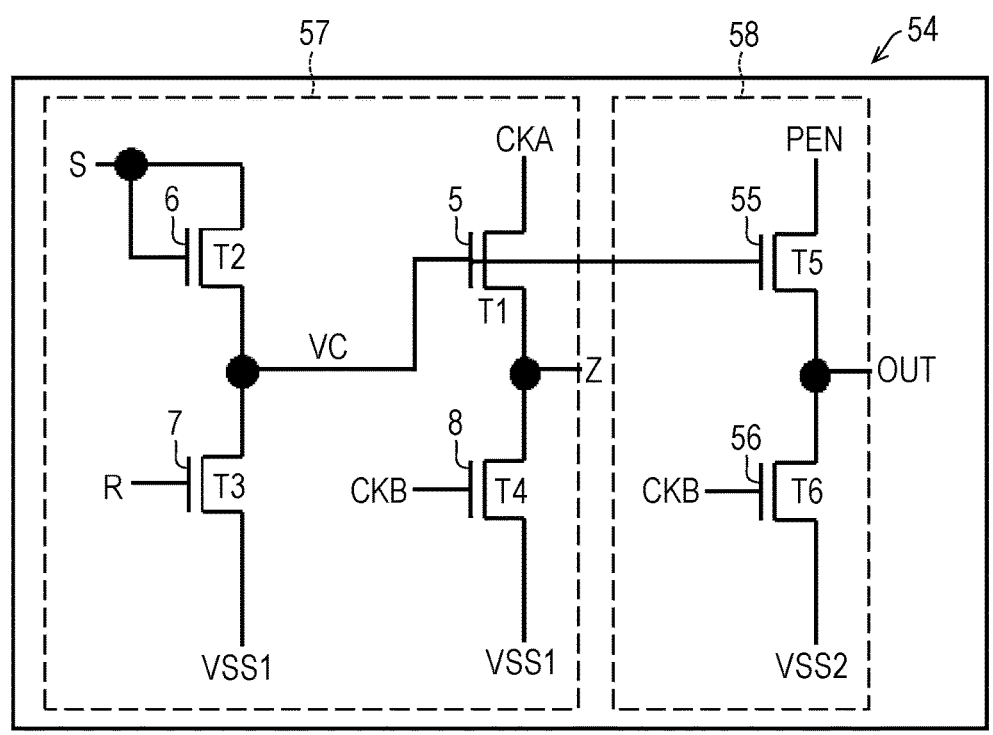

FIG. 12 is a diagram illustrating a schematic configuration of the shift register.

Figure 13:
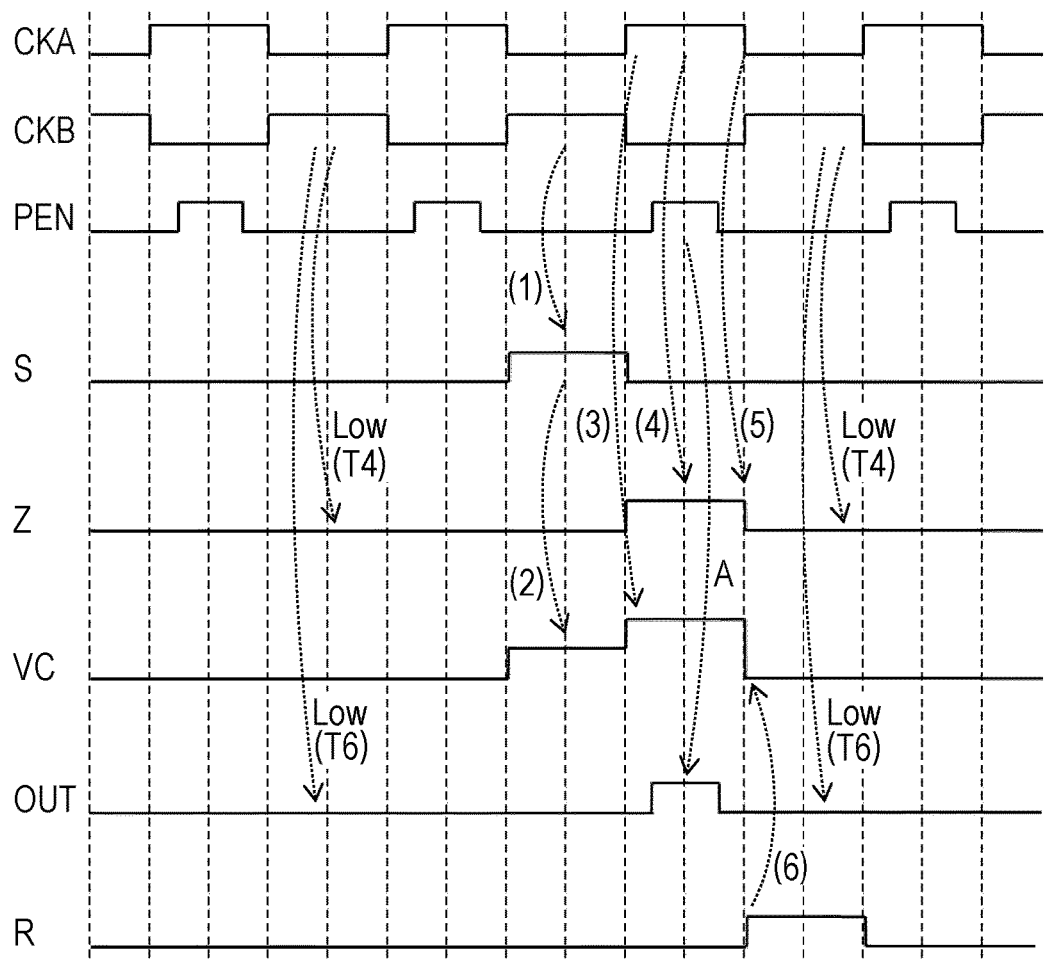

FIG. 13 is a diagram illustrating an example of the drive timing chart for the shift register.

Figure 14:
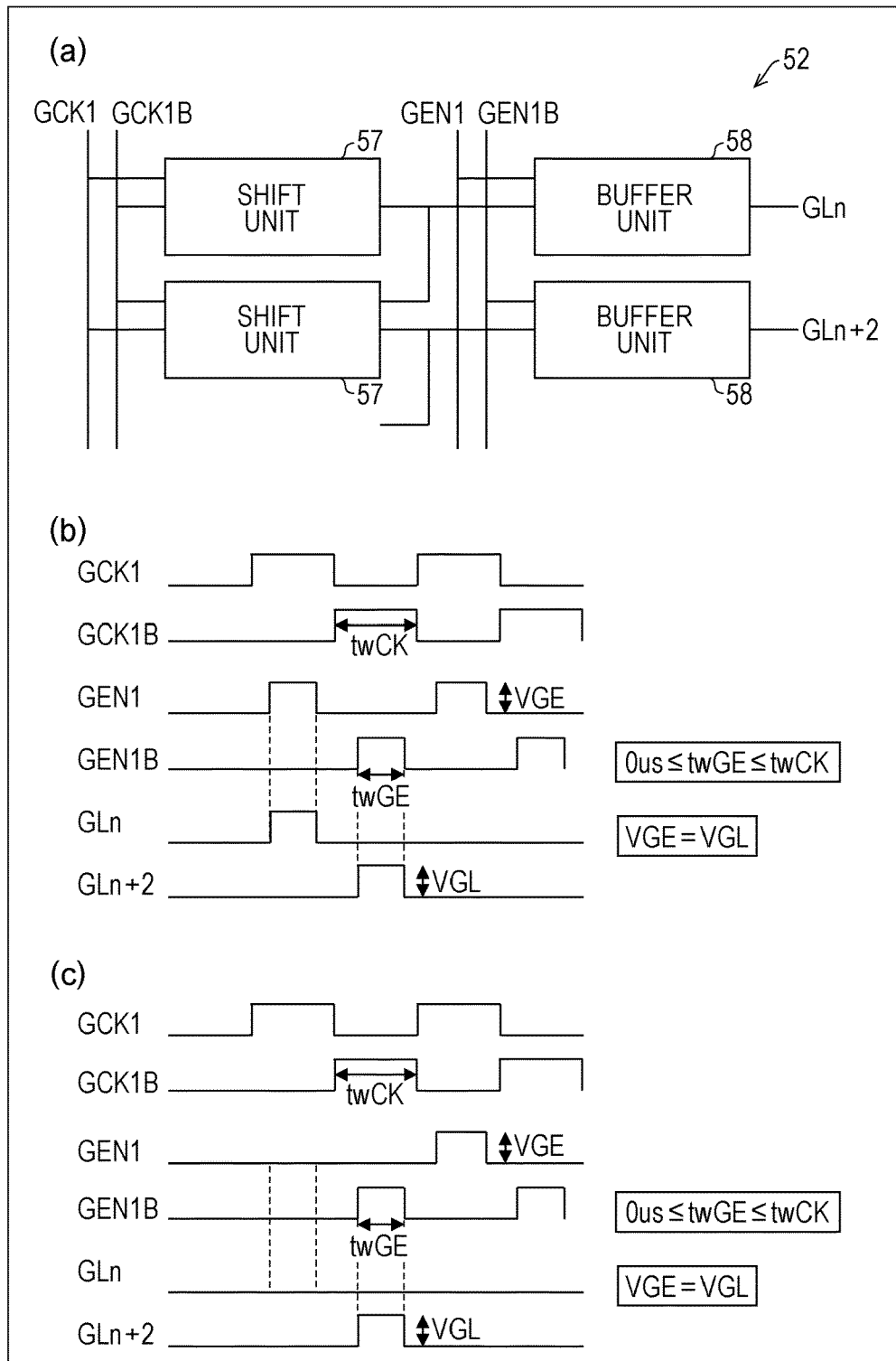

(a) of FIG. 14 is a diagram illustrating a schematic configuration of a shift register block. (b) of FIG. 14 is a diagram illustrating a case where an output signal of which a voltage and a voltage magnitude are adjusted is output from an output terminal of the shift register. (c) of FIG. 14 is a diagram illustrating a case where, due to a skip function, the output signal is not output from the output term of the shift register.

Figure 15:
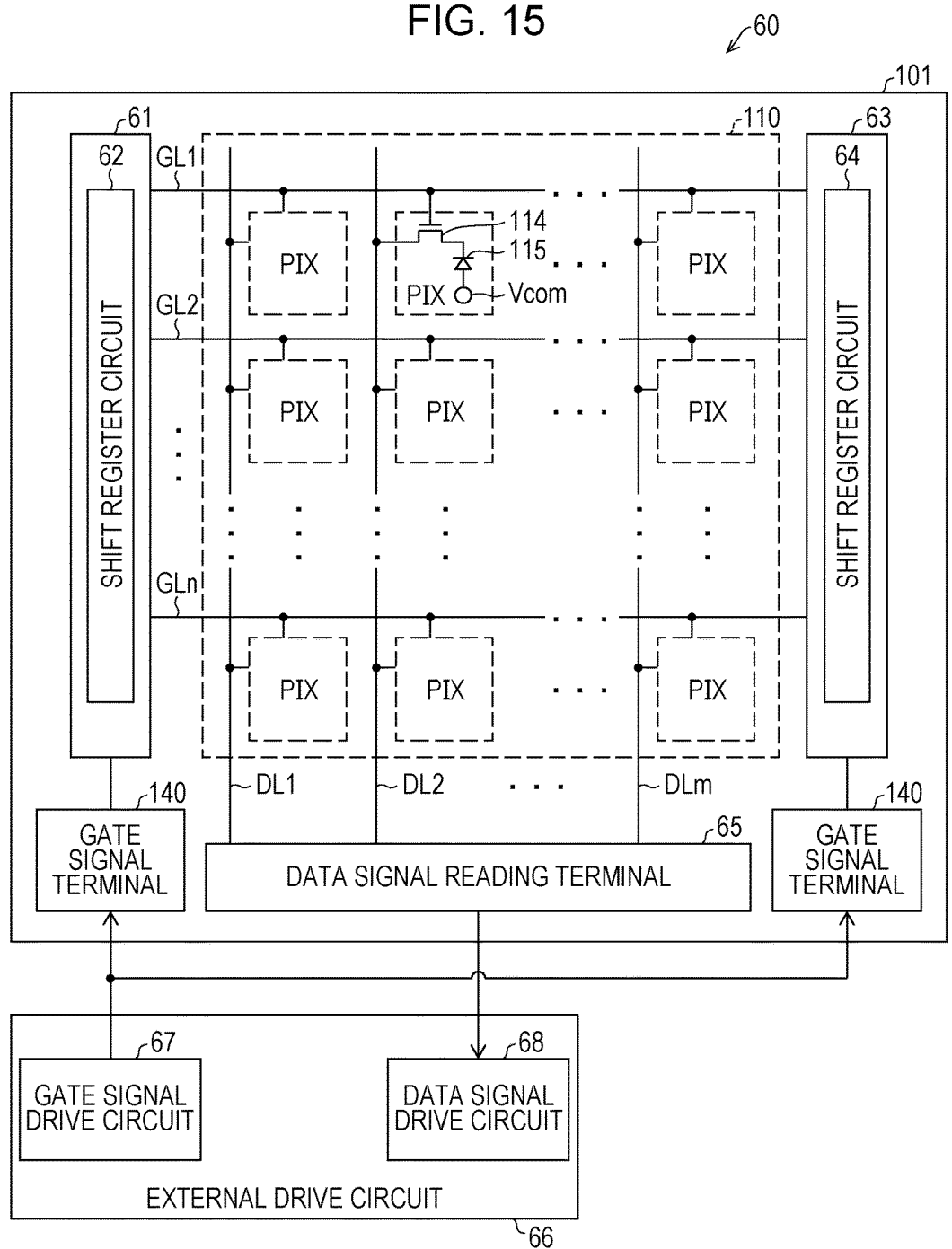

FIG. 15 is a diagram illustrating a schematic configuration of the imaging device in which two gate drivers that are formed with GDM are provided on the active substrate.

Figure 16:
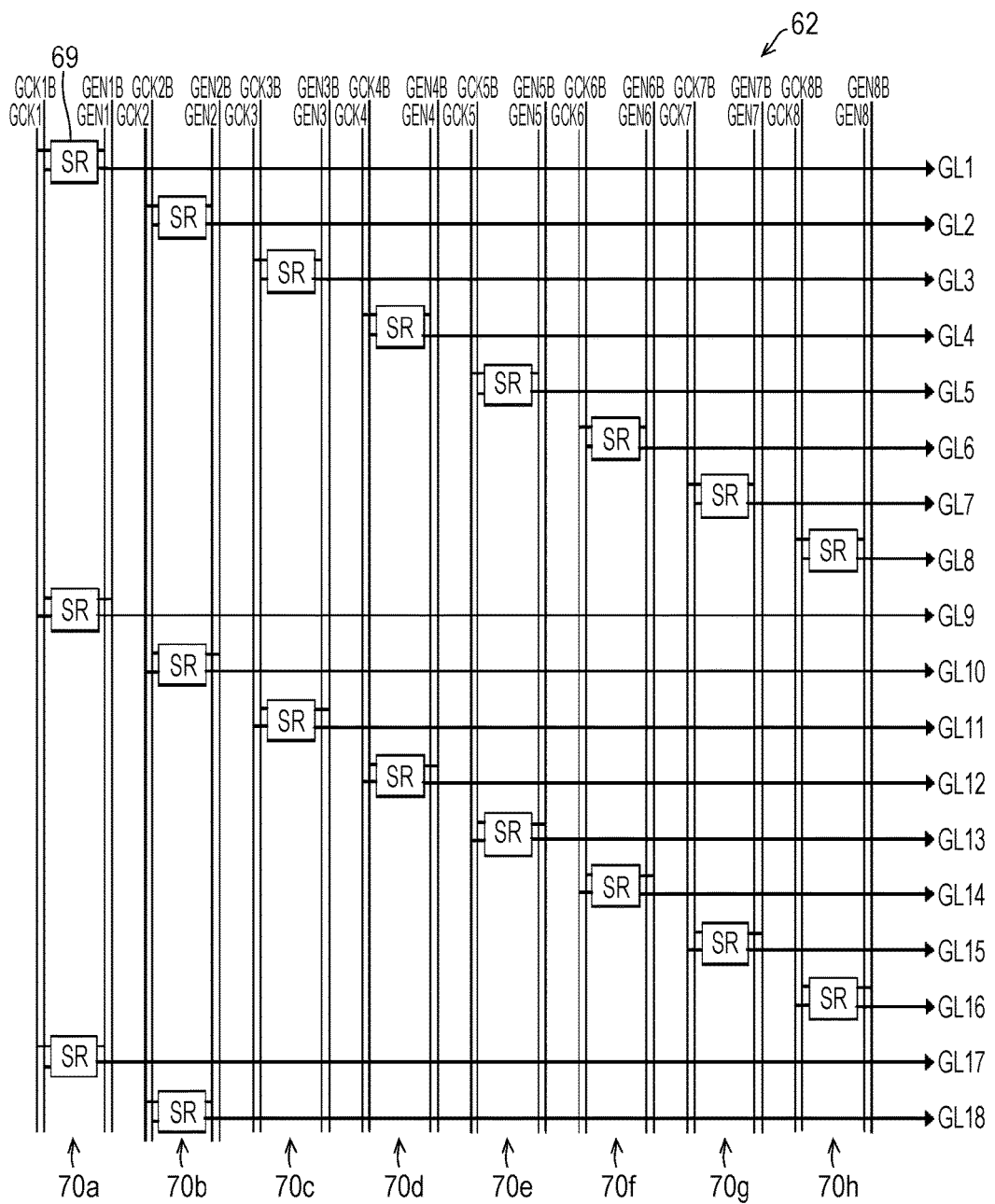

FIG. 16 is a diagram illustrating a schematic configuration of the shift register circuit.

Figure 17:
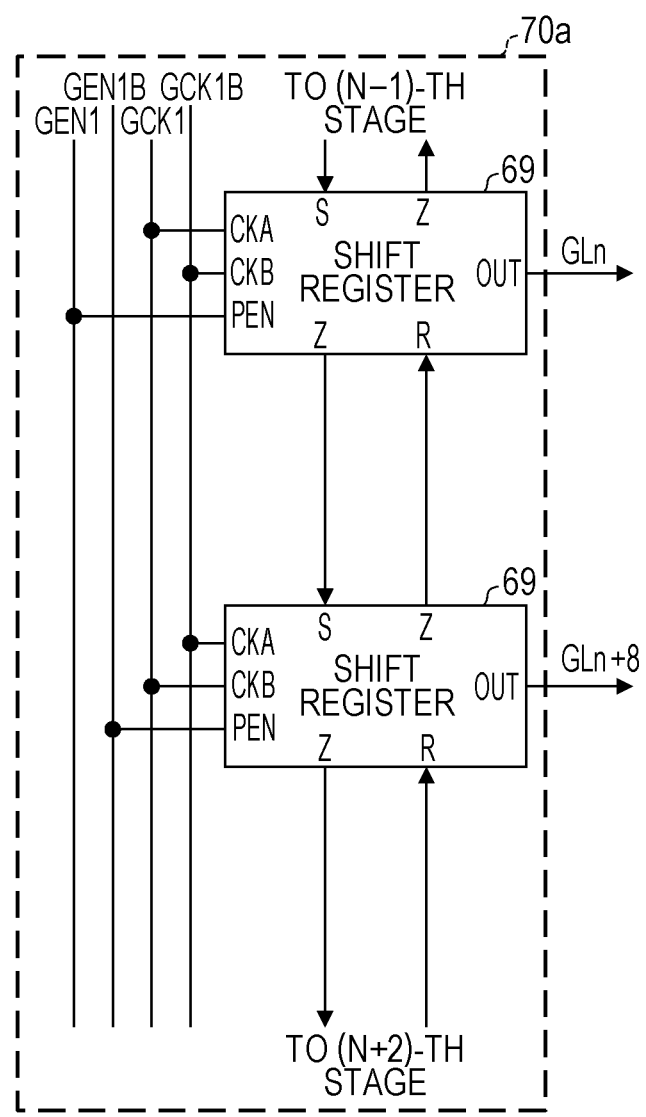

FIG. 17 is a diagram illustrating a schematic configuration of the shift register block.

Figure 18:
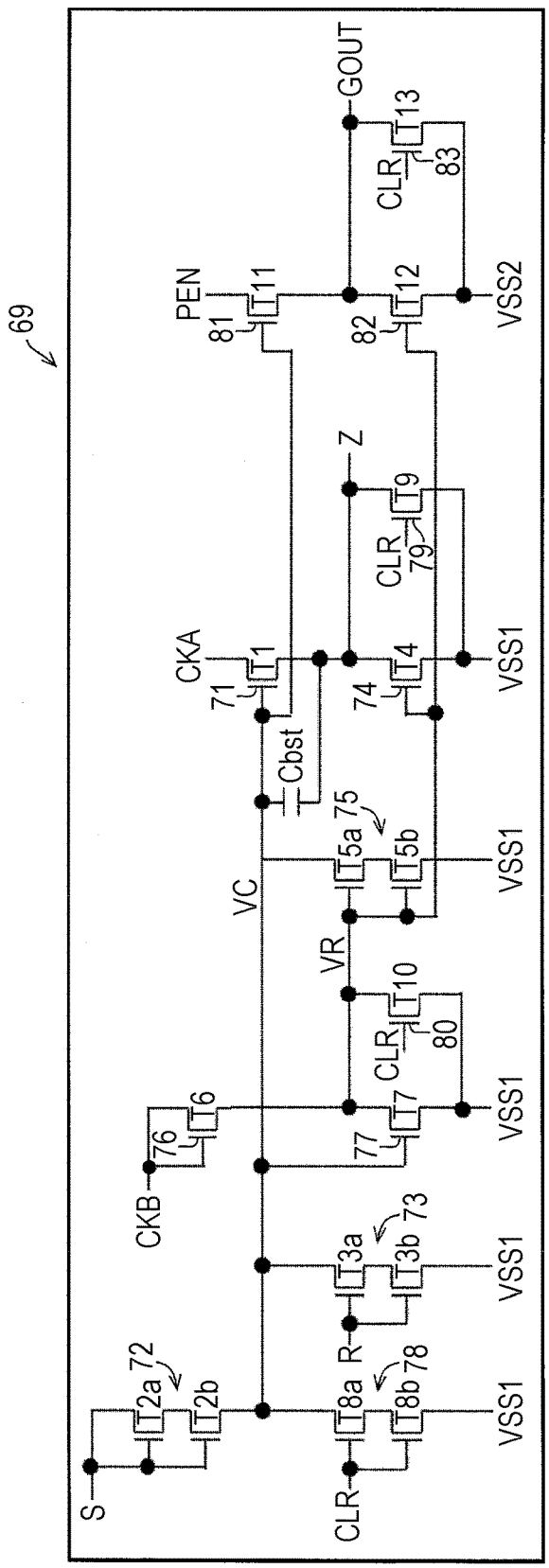

FIG. 18 is a diagram illustrating a schematic configuration of the shift register.

Figure 19:
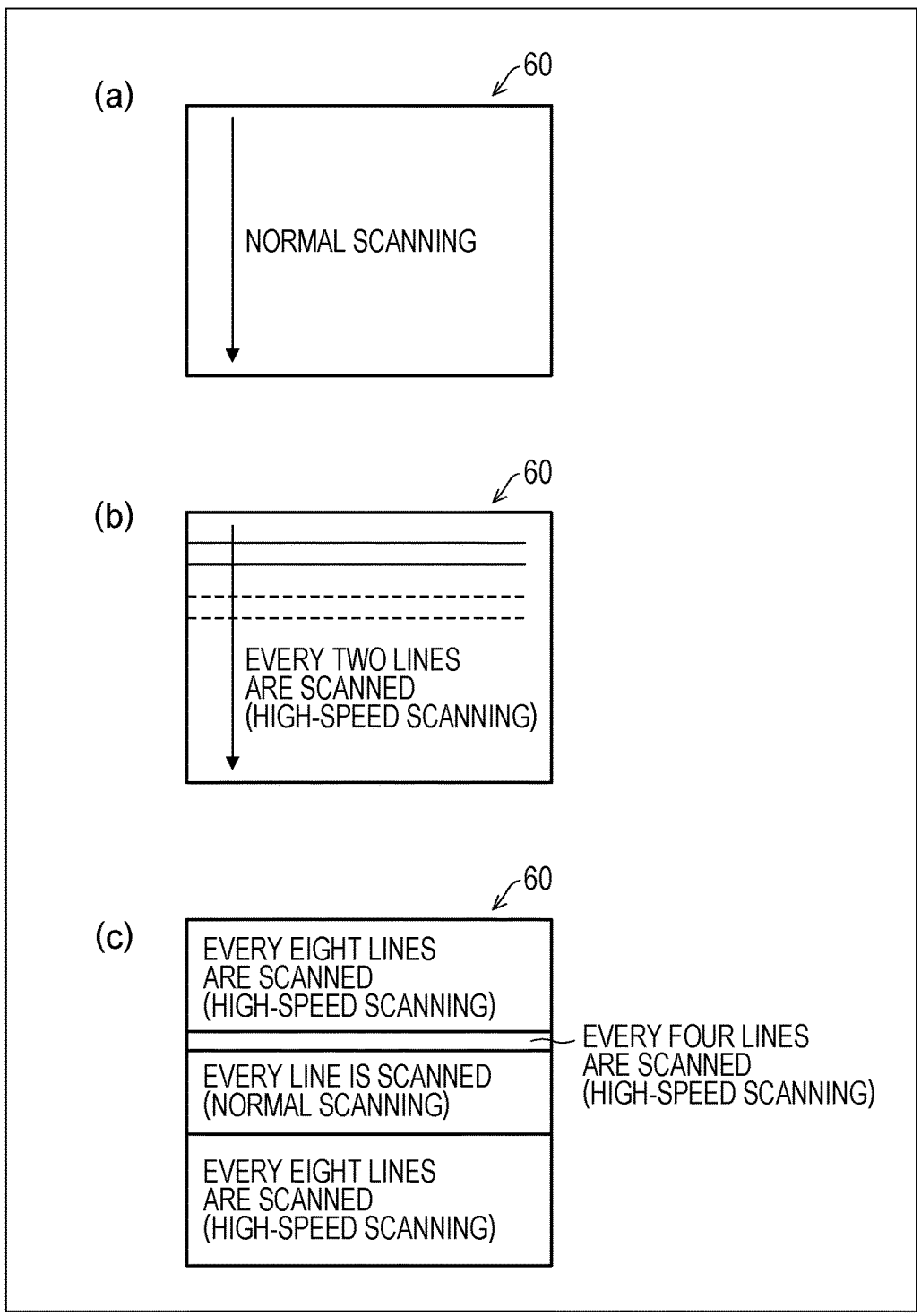

FIG. 19 is a diagram illustrating an example of a method of making scanning possible in the imaging device.

Figure 20:
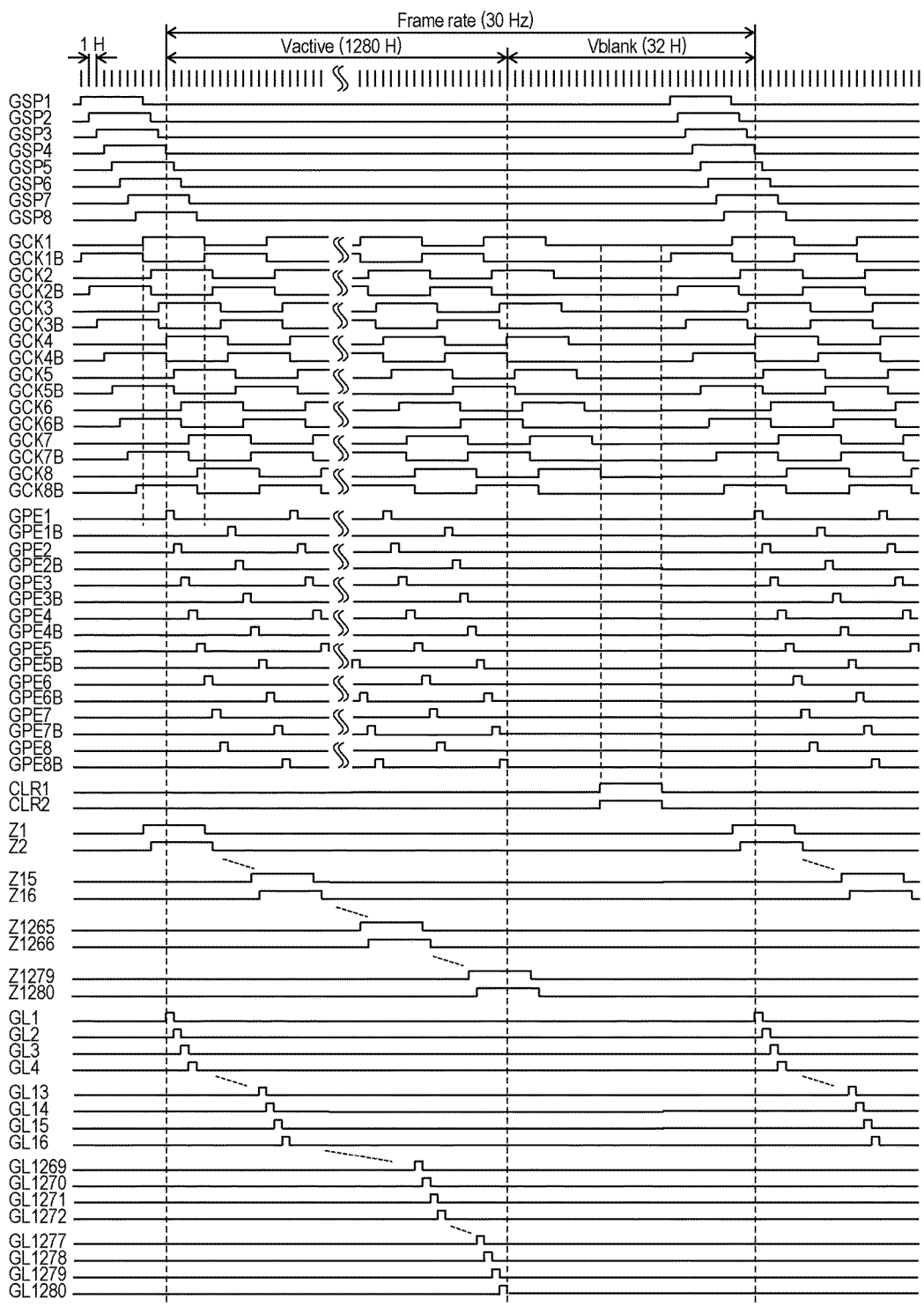

FIG. 20 is an example of a timing chart in a case where the normal scanning of all scan signal lines in the imaging device is performed, which is illustrated in (a) of FIG. 19.

Figure 21:
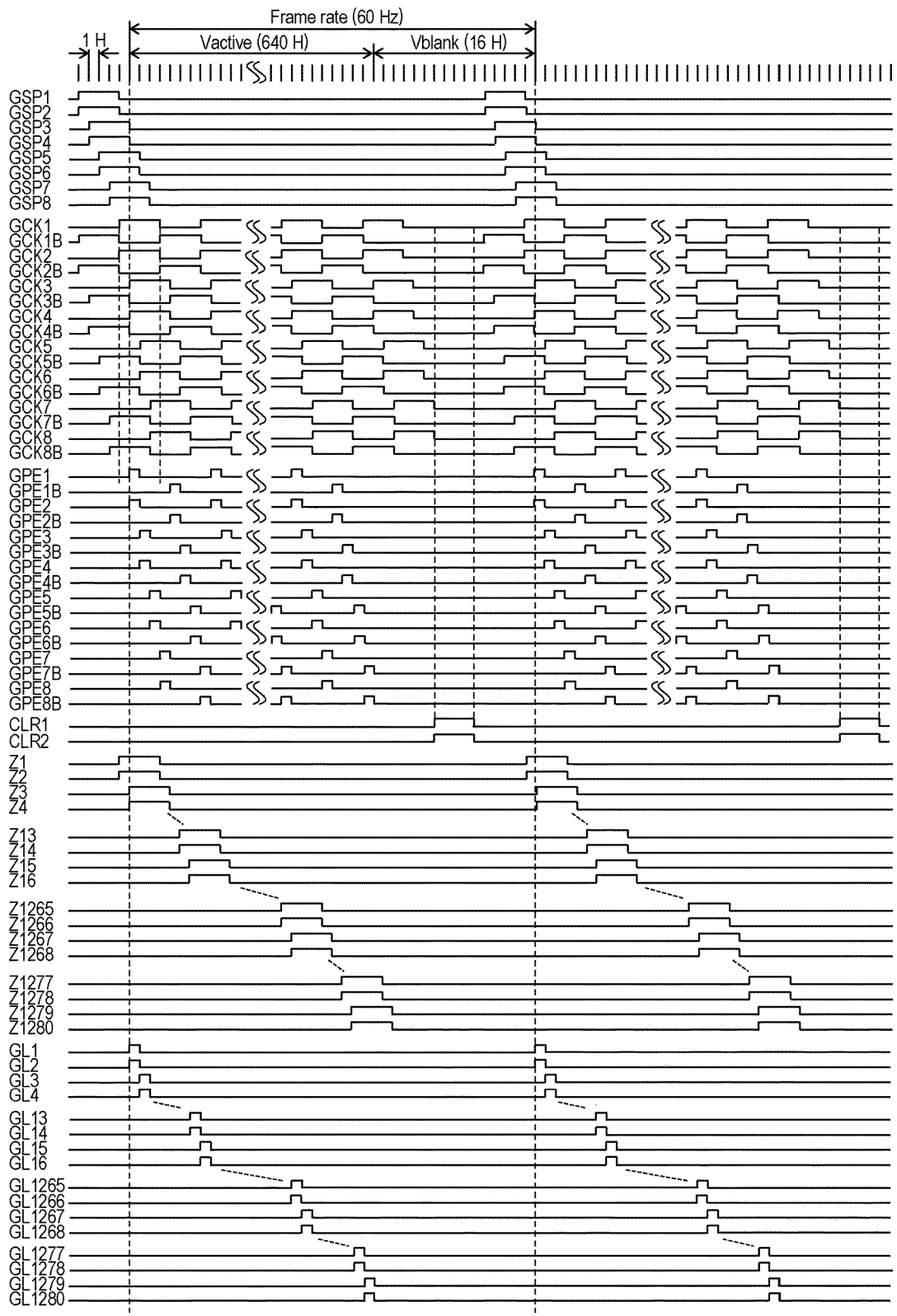

FIG. 21 is an example of a timing chart in a case where the high-speed scanning is performed for every two neighboring scan signal lines, among all scan signal lines in the imaging device that is illustrated in (b) of FIG. 19.

Figure 22:
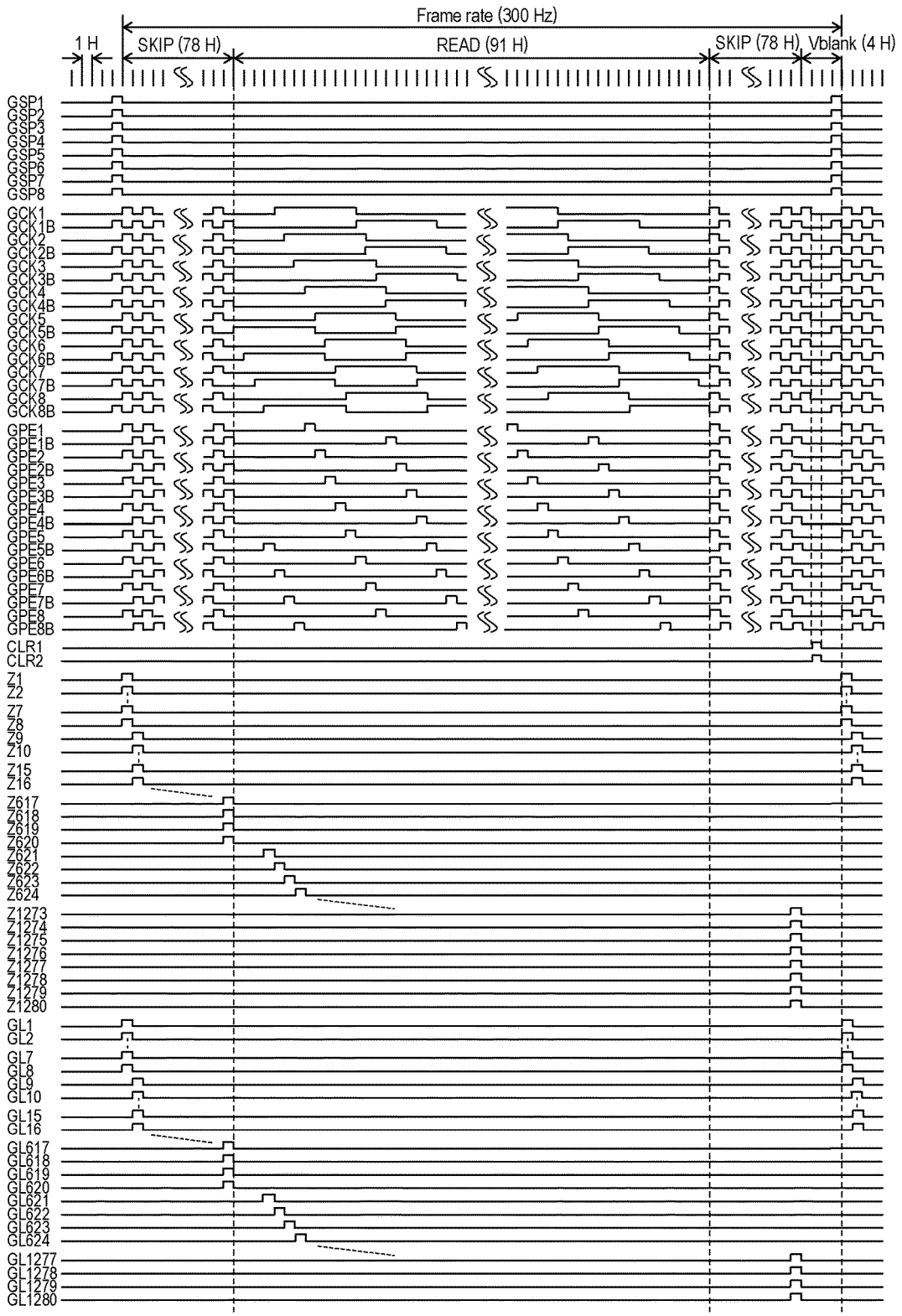

FIG. 22 is an example of a timing chart in a case where the high-speed scanning of performed for every eight neighboring scan signal lines or every four neighboring scan signal lines, among some of the all scan signal lines in the imaging device, and where the normal scanning is performed for every scan signal line, among others of the all scan signal lines in the imaging device that is illustrated in (c) of FIG. 19.

Figure 23:
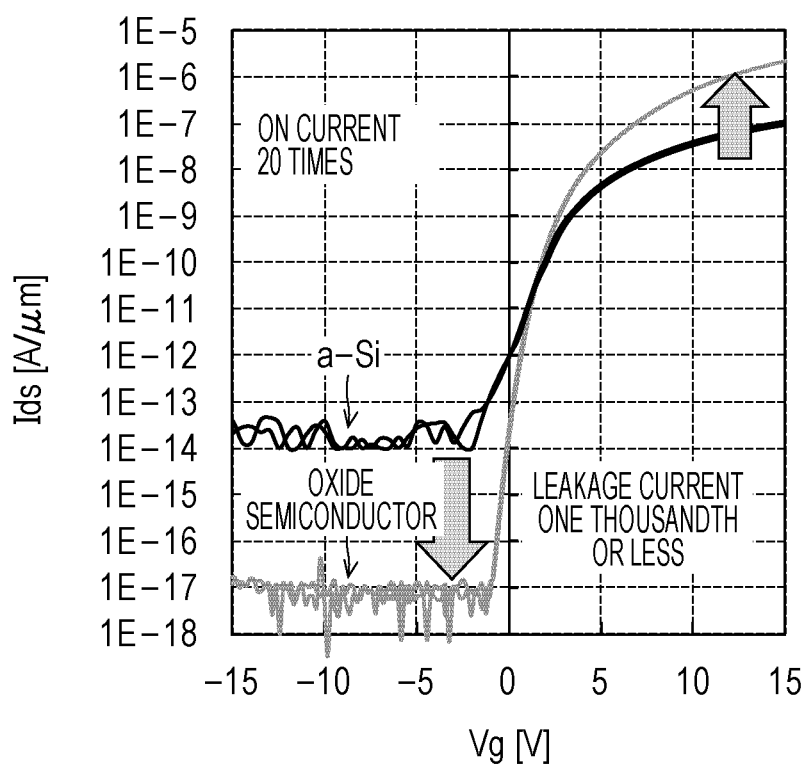

FIG. 23 is a diagram illustrating a characteristic of a transistor that includes an In—Ga—Zn—O-based semiconductor layer that is an oxide semiconductor layer.

Figure 24:
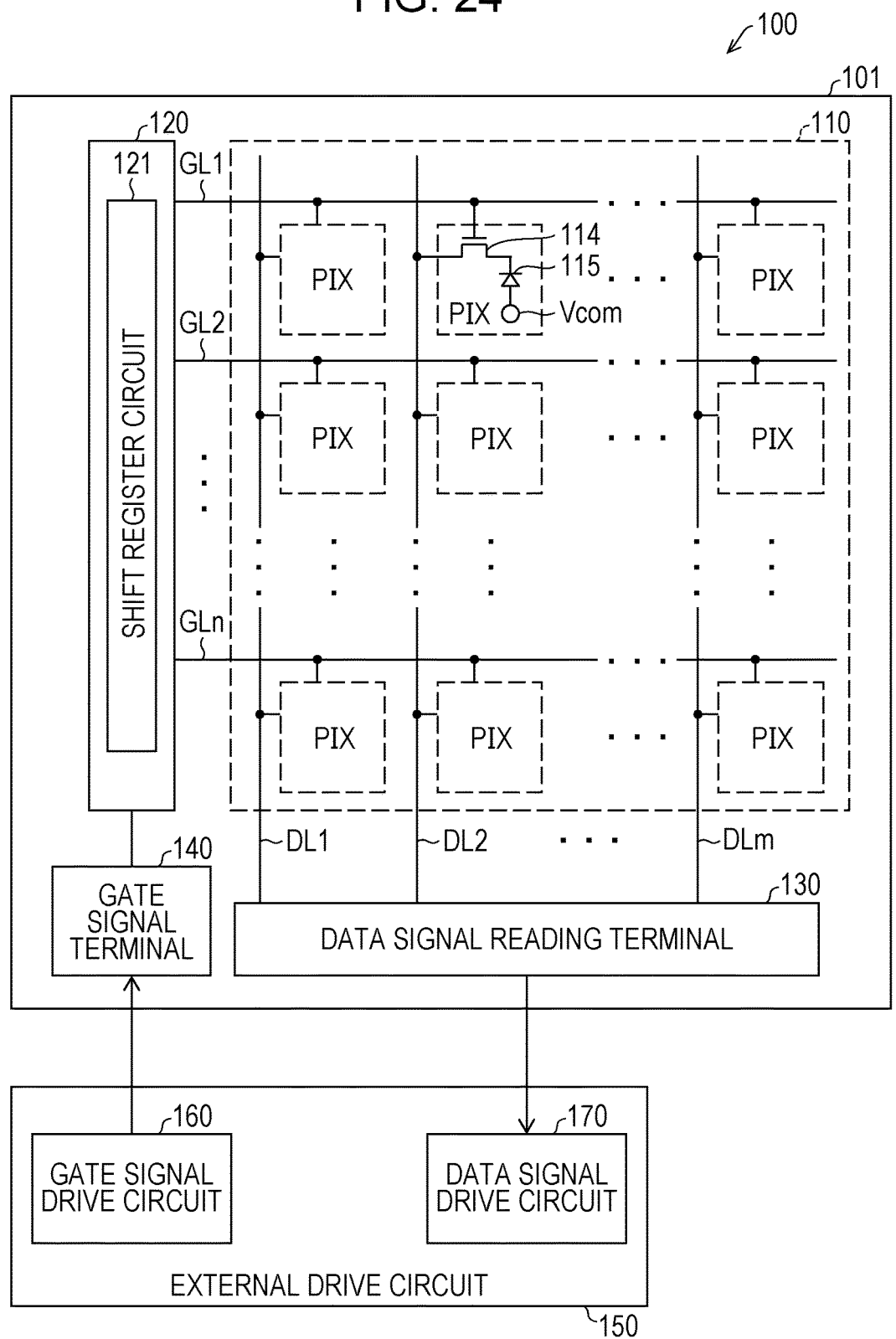

FIG. 24 is a diagram illustrating a schematic configuration of an imaging device in the related art.

Figure 25:
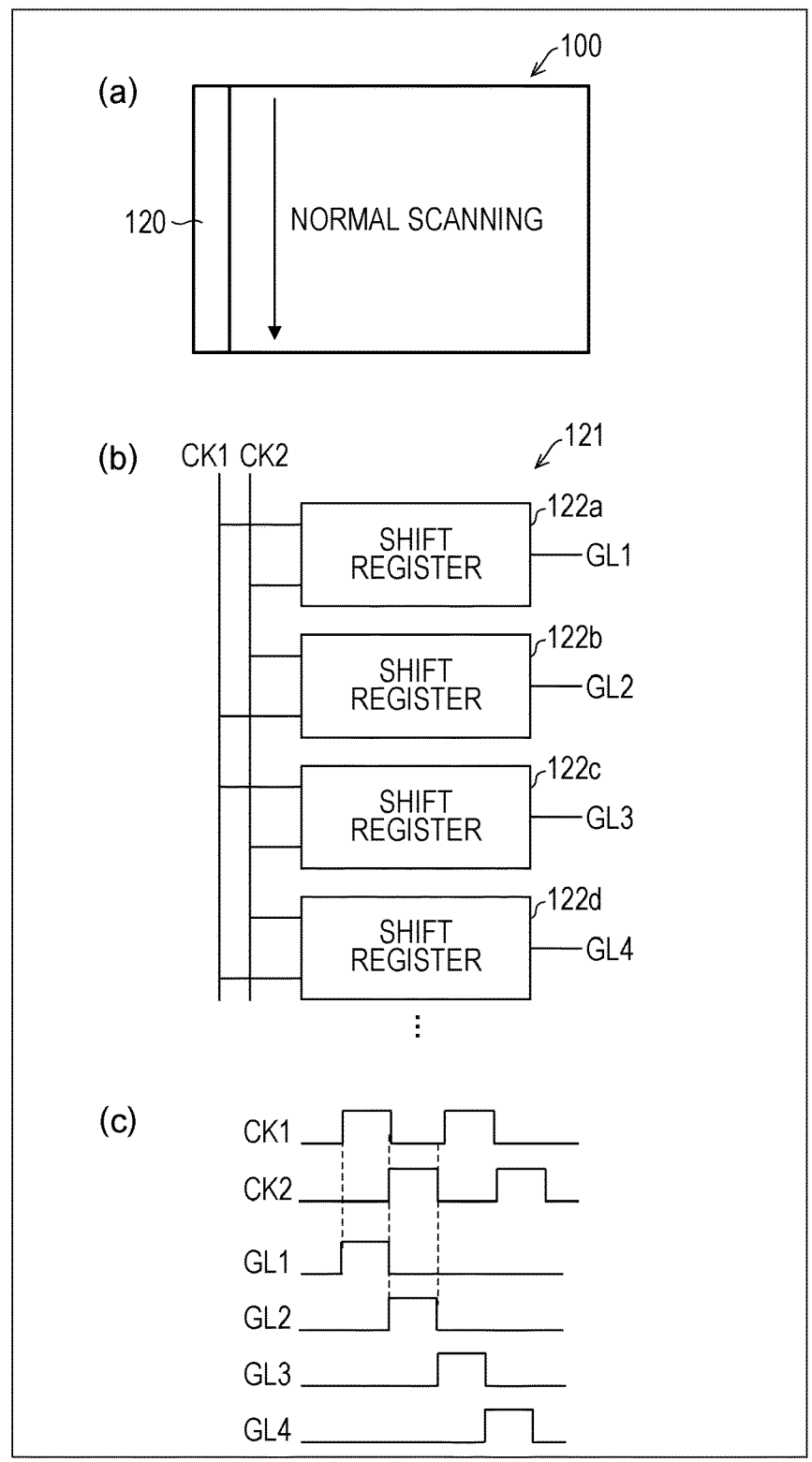

(a) of FIG. 25 is a diagram illustrating a method of scanning the scan signal lines, which can be performed using a gate driver that is included in the imaging device in the related art. (b) of FIG. 25 is a diagram illustrating a schematic diagram of a shift register circuit that is included in the gate driver. (c) of FIG. 25 is a diagram illustrating a signal that is input into a shift register circuit and a signal that is output from the shift register circuit.

DESCRIPTION OF EMBODIMENTS

Embodiments of the present disclosure will be described as follows with reference to FIGS. 1 to 23. In some cases, for convenience of description, a constituent element that has the same function as a constituent element described in a specific embodiment is hereinafter given the same reference character, and a description thereof is omitted.

Embodiment 1

Embodiment 1 of the present disclosure will be described below with reference to FIGS. 1 to 6. In the present embodiment, a configuration of a shift register circuit that is included in a gate driver (a drive circuit) is different from that of a shift register circuit 121 that is included in a gate driver 120 of an imaging device 100 in the related art, which is illustrated in FIG. 24, and configurations of toe other constituent elements are the same as those of the constituent elements of the imaging device 100 in the related art, which are described above. For convenience of description, a description of a member that has the same function as the member of the imaging device 100 in the related art, which is already described, is omitted.

Figure 1:
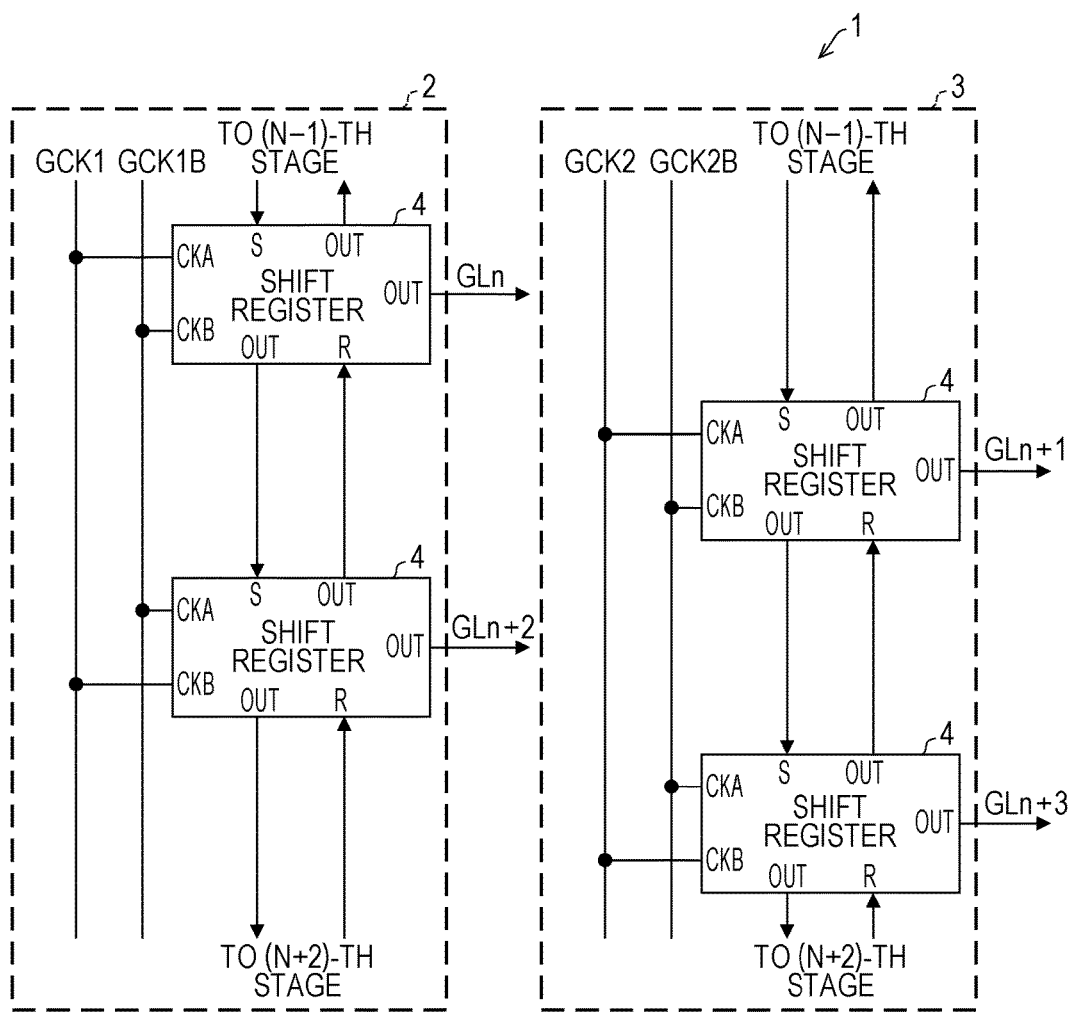
FIG. 1 is a diagram illustrating a schematic configuration of a shift register circuit that is included in a gate driver on an active substrate.

FIG. 1 is a diagram illustrating a schematic configuration of a shift register circuit that is included in a gate driver on an active substrate 1.

In the active substrate 1, in the same manner as in an active substrate 101 that is illustrated in FIG. 24, a TFT element 114 that includes a semiconductor layer, and a gate driver that drives a plurality of scan signal lines, each of which is connected to the TFT element 114, are formed on the same substrate. An illustration of this configuration is omitted.

As illustrated in FIG. 1, the gate driver (the drive circuit) that is included on the active substrate 1 includes two shift register blocks, in each of which a plurality of stage-wise shift registers 4, each of which outputs an output signal to one of the plurality of scan signal Ines, are included.

Then, shift registers in the same stage in two shift register blocks, shift register blocks 2 and 3, are connected to N neighboring scan signal lines, respectively. For example, an N-th stage shift register 4 in the shift register block 2 is connected to a scan signal line GLn, an N-th stage shift register in the shift register block 3 is connected to a can signal line GLn+1 that is adjacent to the scan signal line GLn, an (N+1)-th stage shift register 4 in the shift register block 2 is connected to a scan signal line GLn+2, and an (N+1)-th stage shift register 4 in the shift register block 3 is connected to a scan signal line GLn+3 that is adjacent to the scan signal line GLn+2.

Then, two phase clocks, phase clocks GCK1 and GCK1B, are input into the shift register block, and two phase clocks, phase clocks GCK2 and GCK2B, are input into the shift register block 3.

Each of the shift register blocks 2 and 3 is configured with plurality of stages that result from cascading-connecting the shift registers 4.

In the shift register block 2, for example, an OUT signal (an output signal that is output from an OUT terminal OUT) of an (N−1)-th stage shift register 4, that is, an output signal to a can signal line GLn−2, is input as an S signal (a set signal that is input into a set terminal S) of the N-th stage shift register 4, and an OUT signal (an output signal that is output from an OUT terminal OUT) of the (N+1)-th stage shift register 4, that is, an output signal to the scan signal line GLn+2, is input as an R signal (a reset signal that is input into a reset terminal R) of the N-th stage shift register 4.

On the other hand, in the shift register block 3, for example, an OUT signal of an (N−1)-th stage shift register 4 that is, an output signal to a scan signal line GLn−1, is input as an S signal of the N-th stage shift register 4 (a set signal that is input into a set terminal S), and an OUT signal of the (N+1)-stage shift register 4, that is, an output signal to the scan signal line GLn+3, is input as an R signal (a reset signal that is input into a reset terminal R) of the N-th stage shift register 4.

It is noted that, in the shift register block 2, when a first clock signal GCK1 is input from a first input terminal CKA of the N-th stage shalt register 4, a second clock signal GCK1B is input from a second input terminal CKB of the N-th stage shift register 4, the second clock signal GCK1B is input from the first input terminal CKA of the (N+1)-stage shift register 4, and the first clock signal GCK1 is input from the second input terminal CKB of the (N+1)-stage shift register 4.

Furthermore, in the shift register block 3, when a first clock signal GCK2 is input from a first input terminal CKA of the N-th stage shift register 4, a second clock signal GCK2B is input from a second input terminal CKB of the N-th stage shift register 4, the second clock signal GCK2B is input from the first input terminal CKA of the (N+1)-stage snit register 4, and the first clock signal GCK2 is input from the second input terminal CKB of the (N+1)-stage shift register 4.

Figure 2:
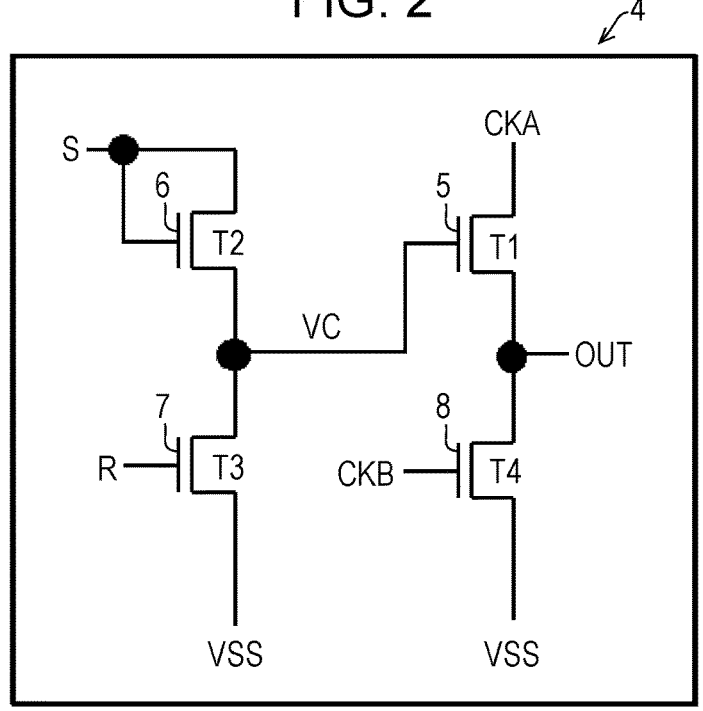
FIG. 2 is a diagram illustrating a schematic configuration of a shift register.

FIG. 2 is a diagram illustrating a schematic configuration of the shift register 4.

As illustrated, the shift register 4 includes a first transistor (T1) 5, a second transistor (T2) 6, a third transistor (T3) 7, and a fourth transistor (T4) 8.

In the first transistor 5, a drain electrode is connected to the first input terminal CKA of the shift register 4, and a source electrode is connected to an output terminal OUT of the shift register 4 which is connected to any of a plurality of scan signal lines GLn.

In the second transistor 6, a gate electrode and a drain electrode are connected to the set terminal S of the shift register 4, and a source electrode is connected to a gate electrode of the first transistor 5.

In the third transistor 7, a gate electrode is connected to the reset terminal R of the shift register 4, a drain electrode is connected to a source electrode of the second transistor 6 and the gate electrode of the first transistor 5, and a source electrode is connected to a low potential-side power VSS.

In the fourth transistor 8, a gate electrode is connected to the second input terminal CKB of the shift register 4, a drain electrode is connected to the output terminal OUT of the shift register 4, and a source electrode is connected to the low potential-side power VSS.

It is noted that the low potential-side power VSS is a voltage that serves as a reference for operation of the shift register 4.

Then, the output signal of the shift register in a preceding stage, as described above, is input into the set terminal S of the shift register 4, one of the first clock signal GCK1 and the second clock signal GCK1B that are different from each other, for example, is input into the first input terminal CKA, and the other of the first clock signal GCK1 and the second clock signal GCK1B that are different from each other is input into the second input terminal CKB.

Figure 3:
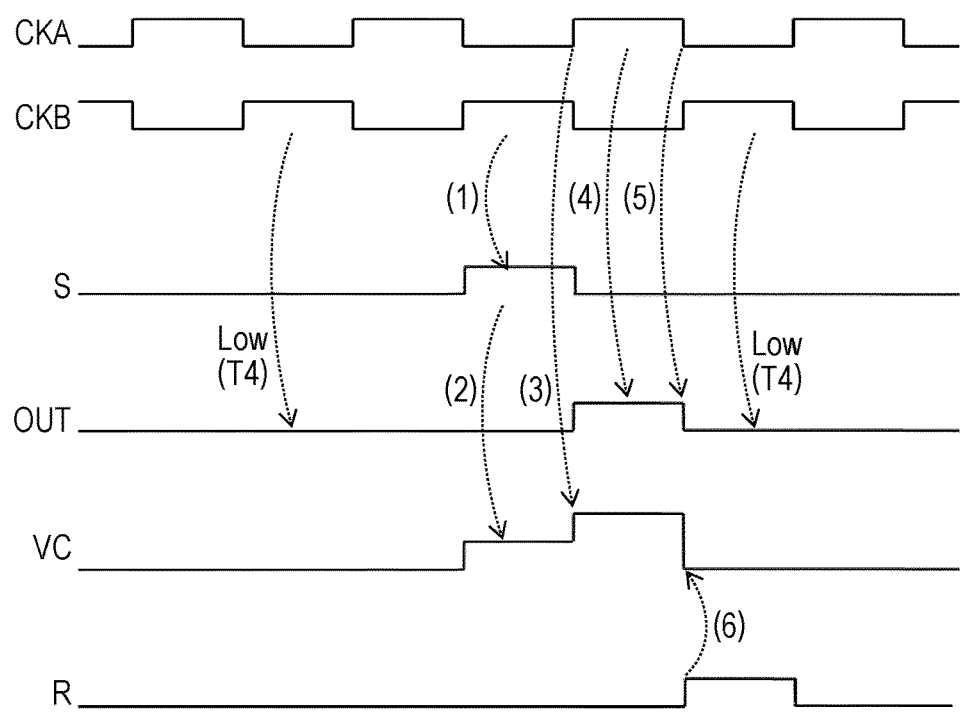
FIG. 3 is a diagram illustrating an example of a drive timing chart for the shift register.

FIG. 3 is a diagram illustrating an example of a drive timing chart for the shift register 4.

As illustrated, in the shift register block 2, the first clock signal GCK1 and the second clock signal GCK1B, which are two phase clocks, are out of phase by a half-cycle and are sequentially input into the first input terminal CKA and the second input terminal CKB, respectively, of the shift register 4 in each stage, and thus drive the shift register 4.

For the driving of the N-th stage shift register 4 in the shift register block 2, first, the (N−1)-th stage shift register 4 in a preceding stage operates, and the output signal that is output from the output terminal OUT of the (N−1)-th stage shift register 4, that is, the output signal to the scan signal line GLn−2, is input into the set terminal S of the N-th stage shift register 4 (refer to (1) in FIG. 3).

Then, as illustrated in FIG. 2, because the second transistor 6 that is connected to the set terminal S is of a diode connection, a VC node VC is recharged (refer to (2) in FIG. 3).

Next, in a state where the gate electrode of the first transistor 5 that is illustrated in FIG. 2 is charged, when the first clock signal GCK1 is input into the first input terminal CKA of the N-th stage shift register 4, the VC node VC is boosted by a bootstrap operation, and thus, as at a high potential (refer to (3) in FIG. 3).

Subsequently, as illustrated in FIG. 3, when the VC node VC is voltage-boosted to a sufficiently high voltage, the first clock signal GCK1 is output to the output terminal OUT of the N-th stage shift register 4, more precisely, the scan signal line GLn (refer to (4) in FIG. 3).

Then, on a rising edge of the first clock signal GCK1, an output signal of the output terminal OUT of the N-th stage shift register 4, more precisely, an output signal of the scan signal line GLn, is pulled down from a High state (an active state) to a Low state (a non-active state) (refer to (5) in FIG. 3).

Thereafter, an output signal of the output terminal OUT of the (N+1)-stage shift register 4 in the shift register block 2, more precisely, an output signal that is output to the scan signal line GLn+2, is input into the reset terminal R of the N-th stage shift register 4, and the VC node VC is brought down to a low potential-side power VSS state (refer to (6) in FIG. 3).

It is noted that in the shift register block 3, the shift register 4 is also driven in the same manner as described above with reference to FIG. 3 and that an illustration of this is omitted.

(a) of FIG. 4 is a diagram illustrating an example of a clock signal that is used in a case of performing normal scanning for sequentially setting scan signal lines to be active in an imaging device that includes the active substrate 1 described above. (b) of FIG. 4 is a diagram illustrating an example of a clock signal that is used in a case of performing high-speed scanning for setting the scan signal lines to be active at the same time in the imaging device that includes the active substrate 1 described above.

As illustrated in of FIG. 4, in the case of performing the normal scanning, for sequentially setting the scan signal lines to be active in the imaging device that includes the active substrate 1 described above, the first clock signal GCK1, the second clock signal GCK1B, the first clock signal GCK2, and the second clock signal GCK2B that are four phase clocks are input into the shift register blocks 2 and 3.

Specifically, the first clock signal GCK1 and the second clock signal GCK1B are input into the shift register block 2, and the first clock signal GCK2 and the second clock signal GCK2B are input into the shift register block 3.

As illustrated, the first clock signal GCK1, the second clock signal GCK1B, the first clock signal GCK2, and the second clock signal GCK2B enter the High state (the active state) in this order: GCK1, GCK2, GCK1B, and GCK2B. The first clock signal GCK1 and the second clock signal GCK1B are input into the shift register 4 in each stage in the shift register block 2. The first clock signal GCK2 and the second clock signal GCK2B are input in the shift register 4 in each stage in the shift register block 3. The shift register 4 in each stage in the shift register blocks 2 and 3 is sequentially selected. The scan signal line that is connected to the output terminal OUT of each shift register 4 sequentially enters the High state (the active state).

On the other hand, as illustrated in (b) of FIG. 4, in the case of performing the high-speed scanning for setting the scan signal lines to be active at the same time in the imaging device that includes the active substrate 1 described above, two phase clocks that are synchronized are input into the shift register blocks 2 and 3, respectively.

Specifically, the first clock signal GCK1 that is input into the shift register block 2 and the first clock signal GCK2 that is input into the shift register block 3 are set to be in-phase clocks, and the second clock signal GCK1B that is input into the shift register block 2 and the second clock signal GCK2B that is input into the shift register block 3 are set to be in-phase clocks.

It is noted that the first clock signal GCK1 is a signal different from the second clock signal GCK1B, and the first clock signal GCK2 is a signal different from the second clock signal GCK2B.

In this manner, two phase clocks that are synchronized are input into the shift register blocks 2 and 3, respectively, and thus, scan signal lines that are connected to the output terminal OUT of each shift register 4 in the shift register blocks 2 and 3, two neighboring scan signal lines at a time, enter the High state (the active state) sequentially at the same time. As a result, the high-speed scanning can be realized.

As described above, in the imaging device that includes the active substrate 1 described above, the first clock signal GCK1, the second clock signal GCK1B, the first clock signal GCK2, and the second clock signal GCK2B are set to be signals for the normal scanning or signals for the high-speed scanning, and thus, the normal scanning or the high-speed scanning can be selectively performed on all scan signal lines that are included in the imaging device described above.

FIG. 5 is a diagram for describing a change in resolution and a change in a frame rate in a case where, in the imaging device that includes the active substrate 1 described above, the gate driver is driven by the normal scanning mode and the high-speed scanning mode and a data signal drive circuit (a reading circuit) performs reading of all pixel units PIX.

As illustrated, in a case where the imaging device that includes the active substrate 1 described above is caused to switch from a normal scanning mode to the high-speed scanning mode, because neighboring scan signal lines, two neighboring scan signal lines at a time, enter the High state (the active state) sequentially at the same time, the resolution of the imaging device decreases to a half and the frame rate thereof increases twice as high.

It is noted that, in the present embodiment, as an example, a case where two shift register blocks are included is described. However, it is noted that, in a case where three shift register blocks are included, the resolution of the imaging device decreases to one third, and the frame rate thereof increases three times as high, that in a case where four shift register blocks are included, the resolution of the imaging device decreases to one fourth, and the frame rate thereof increases four times as high, and that in a case where N shift register blocks are included, the resolution of the imaging device decreases to 1/N, and the frame rate thereof increases N times as high.

With reference to FIG. 6, a case is described where switching between the normal scanning and the high-speed scanning takes place during a 1V duration (a first vertical duration) in the imaging device that includes the active substrate 1 described above.

(a) of FIG. 6 is a diagram illustrating a portion that is normally scanned and a portion that is scanned at a high-speed in the imaging device that includes the active substrate 1 described above. (b) of FIG. 6 is a diagram illustrating an example of the first clock signal GCK1, the second clock signal GCK1B, the first clock signal GCK2, and the second clock signal GCK2B that are used in this case.

As illustrated in (a) of FIG. 6, in a case where L lines that account for 50% of all scan signal lines in the imaging device that includes the active substrate 1 described above are scanned at a high speed at 240 Hz, where M lines that account for 10% of all scan signal lines are normally scanned at 60 Hz, and where N lines that account for 40% of all scan signal lines are scanned at a high speed at 240 Hz, it is possible that, while maintaining high resolution, a scanning operation at a high-speed frame rate of 222 Hz is per on the M lines that account for 10% of all scan signal lines.

As illustrated in (b) of FIG. 6, for the first clock signal GCK1, the second clock signal GCK1B, the first clock signal GCK2, and the second clock signal GCK2B, a clock drive timing changes two times while scanning in progress, first from the high-speed scanning to the normal scanning and then from the normal scanning to the high-speed scanning.

The first clock signal GCK1, the second clock signal GCK1B, the first clock signal GCK2, and the second clock signal GCK2B are used in this manner, and thus the L lines that account for 50% of all scan signal lines, two neighboring L lines at a time, enter the High state (the active state) sequentially at the same time, the M lines that account for 10% of all scan signal lines, one M line at a time, enter the High state (the active state) sequentially at the same time, and the N lines that account for 40% of all scan signal lines, two neighboring N lines at a time, enter the High state (the active state) sequentially at the same time.

As described above, in the imaging device that includes the active substrate 1 described above, not only can the normal scanning for sequentially setting the scan signal lines to be active be set, but specific scan signal lines can also be set to be active at the same time.

In the present embodiment, as an example, a case is described where the L lines that account for 50% of all scan signal lines, two neighboring L lines at a time, enter the High state (the active state) sequentially at the same time, the M lines that account for of all scan signal lines, one M line at time, enter the High state (the active state) sequentially at the same time, and the L lines that account for 40% of all scan signal lines, two neighboring N lines at a time, enter the High state (the active state) sequentially at the same time, but no limitation to this is imposed. In the active substrate 1, among a plurality of same stages in two shift register blocks, the shift register blocks 2 and 3, two shift registers 4 that belong to each of at least one or more same stages may output an output signal in such a manner that two neighboring scan signal lines are active at the same time.

Embodiment 2

Next, Embodiment 2 of the present disclosure will be described below with reference to FIGS. 7 and 8. The present embodiment is different from Embodiment 1 in that each of the shift registers 14 and 14a in each stage, which are included in each of the two shift register blocks, the shift register blocks 2 and 3, includes a pull-down circuit or a capacity Cbst 12. The other constituent elements are the same as those described in Embodiment 1. For convenience of description, a member that has the same function as the member that is illustrated in the drawings according to Embodiment 1 is given the same reference character, and a description thereof is omitted.

FIG. 7 is a diagram illustrating schematic configurations of the shift registers 14 and 14a, each of which has the pull-down circuit or the capacity Cbst 12.

(a) of FIG. 7 is a diagram illustrating the shift register 14 that includes a DC pull-down circuit that uses potential of a high potential-side power VDD.

A first transistor (T1) 5, a second transistor (T2) 6, a third transistor (T1) 7, and a fourth transistor (T4) 8, which are illustrated in (a) of FIG. 7, are the same as those already described in Embodiment 1, and thus descriptions thereof are omitted here.

In addition to the first transistor 5, the second transistor 6, the third transistor 7, and the fourth transistor 8, the shift register 14 includes a fifth transistor (T5) 9, a sixth transistor (T6) 10, a seventh transistor (T7) 11, and the capacity Cbst 12 that constitute the pull-down circuit.

In the fifth transistor 9, a gate electrode is connected to a VX node VX, a drain electrode is connected to a VC node VC, and a source electrode is connected a low potential-side power VSS.

In the sixth transistor 10, a gate electrode and a drain electrode are connected to the high potential-side power VDD, and a source electrode is connected to the VX node VX.

In the seventh transistor 11, a gate electrode is connected to the VC node VC, a drain electrode is connected to the VX node VX, and a source electrode is connected to the low potential-side power VSS.

It is noted that the high potential-side power VDD and the low potential-side power VSS are voltages that serve as references for operation of the shift register 14.

The sixth transistor 10 and the seventh transistor 11 are circuits, each of which generates a VX signal which is output to the VX node VX. When the shift register 14 is not selected, the VX node VX is pre-charged, via the sixth transistor 10, to a voltage that results from decreasing the potential of the high potential-side power VDD as much as a threshold voltage of the sixth transistor 10, and the VC node VC is at all times pulled down, by the fifth transistor 9 to which the VX node VX is connected, to a potential level of the low potential-side power VSS.

Furthermore, the VX node VX is also connected to the gate electrode of the fourth transistor 8, that is, the fourth transistor 8 for pull-down, of an output node that includes the scan signal line which is connected to the shift register 14, and thus, when the shift register 14 is not selected, the out node described above is at all times pulled down to the potential level of the low potential-side power VSS.

As described above, the shift register 14 includes the DC pull-down circuit, and thus, when the shift register 14 is not selected, a duration during which the VC node VC floats is eliminated, and noise resistance is enhanced. That is, with coupling, the clock signal that is input from the first input terminal CKA of the shift register 14 can completely prevent the VC node VC from floating. Because of this, clock noise of the first input terminal CKA of the shift register 14 can be suppressed from being output to the scan signal line that is connected to toe shift register 14.

It is noted that, when the shift register 14 is selected, the VC node VC is charged by a pre-charging operation, and that then, the seventh transistor 11 is ON and the VX node VX is lowered close to the potential level of the low potential-side power VSS. At this time, the potential that is output to the VX node VX is determined by a ratio between the sixth transistor 10 and the seventh transistor 11. In the present embodiment, the seventh transistor 11 is increased in capacity compared with the sixth transistor, and thus in a case where the seventh transistor 11 is ON, the VX node VX is lowered close to the potential level of the low potential-side power VSS.

(b) of FIG. 7 is a diagram illustrating the shift register 14a that includes a CK pull-down circuit that uses a signal which is input from a CKB terminal.

In addition to the first transistor 5, the second transistor 6, the third transistor 7, and the fourth transistor 8, the shift register 14a includes a fifth transistor (T5) 9, a sixth transistor (T6) 10, a seventh transistor (T7) 11, and a capacity Cbst 12 that constitute the pull-down circuit.

In the fifth transistor 9, a gate electrode is connected to a VX node VX, a drain electrode is connected to a VC node VC, and a source electrode is connected a low potential-side power VSS.

In the sixth transistor 10, a gate electrode and a drain electrode are connected to a second input terminal CKB of the shift register 14a, and a source electrode is connected to the VX node VX.

In the seventh transistor 11, a gate electrode is connected to the VC node VC, a drain electrode is connected to the VX node VX, and a source electrode is connected to the low potential-side power VSS.

The sixth transistor 10 and the seventh transistor 11 are circuits, each of which generates the VX signal that is output to the VX node VX. When the shift register 14a is not selected, the VX node VX is pre-charged, via the sixth transistor 10, to a voltage that results from decreasing potential of the second input terminal CKB as much as the threshold voltage of the sixth transistor 10, and the VC node VC is at all times pulled down, by the fifth transistor 9 that is connected, to the potential level of the low potential-side power VSS.

Furthermore, the VX node VX is also connected to the gate electrode of the fourth transistor 8, that is, the fourth transistor 8 for pull-down, of an output node that includes the scan signal line which is connected to the shift register 14a, and thus, when the shift register 14a is not selected, the out node described above is at all times pulled down to the potential level of the low potential-side power VSS.

FIG. 8 is a diagram illustrating an example of a drive timing chart for the shift register 14a that includes the CK pull-down circuit.

In FIG. 8, CKA, CKB, S, OUT, VC, VX, and R indicate potential of the first input terminal, potential of the second input terminal, potential of the set terminal S, potential of the output terminal, potential of the VC node, potential of the VX node, and the reset terminal R, respectively.

As described in (1) and (2) in FIG. 8, the shift register 14a includes the CK pull-down circuit, and thus, when the shift register 14a is not selected, the duration during which the VC node VC floats is eliminated, and the noise resistance is enhanced. That is, with coupling, the clock signal that is input from the first input terminal CKA of the shift register 14a can completely prevent the VC node VC from floating. Because of this, clock noise of the first input terminal CKA of the shift register 14a can be suppressed from being output to the scan signal line that is connected to the shift register 14a.

It is noted that, as illustrated in (3) of FIG. 8, when the shift register 14a is selected, if the VC node VC is charged by the pre-charging operation, the seventh transistor 11 is ON and the VX node VX is lowered close to the potential level of the low potential-side power VSS. At this time, the potential that is output to the VX node VX is determined by the ratio between the sixth transistor 10 and the seventh transistor 11. In the present embodiment, the seventh transistor 11 is increased in capacity compared with the sixth transistor, and thus in the case where the seventh transistor 11 is ON, the VX node VX is lowered close to the potential level of the low potential-side power VSS.

It is noted that, as illustrated in (a) and (b) of FIG. 7, each of the shift registers 14 and 14a has the capacity Cbst 12 between the VC node VC and the output node that includes the scan signal line that is connected to each of the shift registers 14 and 14a.

Because the capacity Cbst 12 operates as a capacity that sharply rises up at the time of the bootstrap operation, sharp rising-up efficiency can increase and a drive force can increase.

Furthermore, when each of the shift registers 14 and 14a is not selected, it is possible that an operation is performed in such a manner that potential of the VC node VC is stabilized and that, with the coupling, the clock signal that is input from the first input terminal CKA of each of the shift registers 14 and 14a prevents the VC node VC from floating.

It is noted that, in the present embodiment, as an example, a case is described where the capacity Cbst 12 is included, but that the capacity Cbst 12 may not be included.

Embodiment 3

Next, Embodiment 3 of the present disclosure will be described with reference to FIG. 9. The present embodiment is different from Embodiment 2 in that, based on a CLR signal, the output node which includes the scan signal line that is connected to the VC node VC and a shift register 24 is pulled down, and the other constituent elements are the same as those described above in Embodiment 2. For convenience of description, a member that has the same function as the member that is illustrated in the drawings according to Embodiment 2 is given the same reference character, and a description thereof is omitted.

FIG. 9 is a diagram illustrating a schematic configuration of the shift register 24, in which the output node that includes the scan signal line which is connected to the VC node VC and the shift register 24 is pulled down based on the CLR signal.

The first transistor (T1) 5, the second transistor (T2) 6, the third transistor (T1) 7, the fourth transistor (T4) 8, the fifth transistor (T5) 9, the sixth transistor (T6) 10, and the seventh transistor (T7) 11 are the same as those already described in Embodiments 1 and 2, and thus descriptions thereof are omitted here.

In addition to the first transistor 5, the second transistor 6, the third transistor 7, the fourth transistor 8, the fifth transistor 9, the sixth transistor 10, the seventh transistor 11, and the capacity Cbst 12, the shift register 24 includes an eighth transistor (T8) 13 and a ninth transistor (T9) 15, into gate electrode of which the CLR signal is input.

In the eighth transistor 13, a drain electrode is connected to the VC node VC, and a source electrode is connected to the low potential-side power VSS.

In the ninth transistor 15, a drain electrode is connected to the out node that includes the scan signal line which is connected to the shift register 24, and a source electrode is connected to the low potential-side power VSS.

Then, when the CLR signal is the High state, the VC node VC and the output node that includes the scan signal line which is connected to the shift register 24 are pulled down.

With the configuration described above, the shift registers 24 can be initialized collectively.

Furthermore, at the earliest time during a scan duration, the CLR signal is set to be in the High state, and thus an operation is possible from an imitated state and an operation or an output that is not expected is suppressed. Moreover, at the latest time during the scan duration, the CLR signal is set to be in the High state, and thus the shift register 24 is initialized at the latest time during the scan duration and charge releasing from each node is performed. Therefore, the transistor can be prevented from being degraded due to the remaining charge while an operation is suspended.

It is noted that, as illustrated in FIG. 9, the shift register 24 has the capacity Cbst 12 between the VC node VC and the output node that includes the scan signal line that is connected to the shift registers 24.

Because the capacity Cbst 12 operates as a capacity that sharply rises up at the time of the bootstrap operation, the sharp rising-up efficiency can increase and the drive force can increase.

Furthermore, when the shift registers 24 is not selected, it is possible that an operation is performed in such a manner that the potential of the VC node VC is stabilized and that, with the coupling, the clock signal that is input from the first input terminal CKA of the shift registers 24 prevents the VC node VC from floating.

It is noted that, in the present embodiment, as an example, a case is described where the capacity Cbst 12 is included, but that the capacity Cbst 12 may not be included.

Embodiment 4

Next, Embodiment 4 of the present disclosure will be described with reference to FIG. 10. The present embodiment is different from Embodiment 3 in that, in a shift register 34, a second transistor 26, a third transistor 27, a fifth transistor 29, and an eighth transistor 23 are set to the transistors each of which has a dual-gate structure, and the other constituent elements are the same as those described in Embodiment 3. For convenience of description, a member that has the same function as the member that is illustrated in the drawings according to Embodiment 3 is given the same reference character, and a description thereof is omitted.

FIG. 10 is a diagram illustrating a schematic configuration of the shift register 34, one or several transistors of which are transistors each of which has the dual-gate structure.

As illustrated, in the shift register 34, a second transistor (T2a and T2b) 26, a third transistor (T3a and T3b) 27, a fifth transistor (T5a and T5b) 29, and an eighth transistor (T8a and T8b) 23 are set to be transistors, each of which has the dual-gate structure.

It is noted that the transistor which as the dual-gate structure is one that results from cascade-connecting two transistors, T2a and T2b.

As described above, in the shift register 34, the second transistor (T2a and T2b) 26, the third transistor (T3a and T3b) 27, the fifth transistor (T5a and T5b) 29, and the eighth transistor (T8a and T8b) 23 are set to be transistors, each of which has the dual-gate structure, and thus, when the VC node VC is boosted by a bootstrap while an operation is in progress, a potential difference Vds that is applied between the source electrode and the drain electrode can be decreased to approximately a half in these transistors. As a result, an improvement in pressure resistance is possible.

Embodiment 5

Next, Embodiment 5 of the present disclosure will be described with reference to FIGS. 11 to 14. The present embodiment is different from Embodiments 1 to 4 in that each of the shift registers blocks 52 and 53 includes a shift 57 and a buffer unit 58, and the other constituent elements are the same as those described in Embodiments 1 to 4. For convenience of description, a member that has the same function as the member that is illustrated in the drawings according to Embodiments 1 to 4 is given the same reference character, and a description thereof is omitted.

FIG. 11 is a diagram illustrating a schematic configuration of a shift register circuit that is included in a gate driver on an active substrate 51.

In the active substrate 51, in the same manner as in the active substrate 101 that is illustrated in FIG. 24, the TFT element 114 that includes a semiconductor layer, and the gate driver that drives a plurality of scan signal lines, each of which is connected to the TFT element 114 are formed on the same substrate. An illustration of this configuration is omitted.

As illustrated in FIG. 11, the gate driver (the drive circuit) that is included on the active substrate 51 includes two shift register blocks, in each of which a plurality of stage-wise shift registers 54, each of which outputs an output signal to one of the plurality of scan signal lines, are included.

Then, shift registers in the same stage in two shift register blocks, the shift register blocks 52 and 53, are connected to N neighboring scan signal lines, respectively. For example, an N-th stage shift register 54 in the shift register block 52 is connected to a scan signal line GLn, an N-th stage shift register 54 in the shift register block 53 is connected to a scan signal line GLn+1 that is adjacent to the scan signal line GLn, an (N+1)-th stage shift register 54 in the shift register block 52 is connected to a scan signal line GLn+2, and an (N+1)-th stage shift register 54 in the shift register block Si is connected to a an signal line GLn+3 that is adjacent to the scan signal line GLn+2.

Then, two phase blocks, phase blocks GCK1 and GCK1B, and two enable signals, enable signals GEN1 and GEN1B, are input into the shift register block 52, and two phase blocks, phase blocks GCK2 and GCK2B, and two enable signals, enable signals GEN2 and GEN2B, are input into the shift register block 53.

Each of the shift register blocks 52 and 53 is configured with a plurality of stages that result from cascading-connecting shift registers 54.

In the shift register block 52, for example, a Z signal (an output signal that is output from a Z terminal) of an (N−1)-th stage shift register 54 is input as an S signal (a set signal that is input into a set terminal S) of the N-th stage shift register 54, and a Z signal (the output signal that is output from the Z terminal) of the (N+1)-th stage shift register 54 is input as an R signal (a reset signal that is input into a reset terminal R) of the N-th stage shift register 54.

On the other hand, in the shift register block 53, for example, a Z signal (an output signal that is output from a second output terminal Z) of the (N−1)-th stage shift register 54 is input as an S signal (a set signal that is input into a set terminal S) of the N-th stage shift register 54, and a Z signal (the output signal that is output from the second output terminal Z) of the (N+1)-th stage shift register 54 is input as an R signal (a reset signal that is input into a reset terminal R) of the N-th stage shift register 54.

It is noted that, in the shift register block 52, when a first clock signal GCK1 is input from a first input terminal CKA of the N-th stage shift register 54, a second clock signal GCK1B is input from a second input terminal CKB of the N-th stage shift register 54, a second clock signal GCK1B is input from a first input terminal CKA of the (N+1)-stage shift register 54, and a first clock signal GCK1 is input from a second input terminal CKB the (N+1)-stage shift register 54.

Furthermore, in the shift register block 53, when a first clock signal GCK2 is input from a first input terminal CKA of the N-th stage shift register 54, a second clock signal GCK2B is input from a second input terminal CKB of the N-th stage shift register 54, the second clock signal GCK2B is input from the first input terminal CKA of the (N+1)-stage shift register 54, and the first clock signal GCK2 is input from the second input terminal CKB of the (N+1)-stage shift register 54.

FIG. 12 is a diagram illustrating a schematic configuration of the shift register 54.

As illustrated, the shift register 54 includes the first transistor (T1) 5, the second transistor (T2) 6, the third transistor (T3) 7, the fourth transistor (T4) 8, a fifth transistor (T5) 55, and a sixth transistor (T6) 56.

Then, the first transistor 5, the second transistor 6, the third transistor 7, and the fourth transistor 8 constitute the shift 57, and the fifth transistor (T5) 55 and the sixth transistor (T3) 56 constitute the buffer unit 58.

In the first transistor 5, a drain electrode is connected to the first input terminal CKA of the shift register 54, and a source electrode is connected to the second output terminal Z of the shift register 54.

In the second transistor 6, a gate electrode and a drain electrode are connected to the set terminal S of the shift register 54, and a source electrode is connected to a gate electrode of the first transistor 5.

In the third transistor 7, a gate electrode is connected to the reset terminal R of the shift register 54, a drain electrode is connected to a source electrode of the second transistor 6 and the gate electrode of the first transistor 5, and a source electrode is connected to a first low potential-side power VSS1.

In the fourth transistor 8, a gate electrode is connected to the second input terminal CKB of the shift register 54, a drain electrode is connected to the second output terminal Z, and a source electrode is connected to the first low potential-side power VSS1.

In the fifth transistor 55, a gate electrode is connected to the VC node VC that is connected to the source electrode of the second transistor 6, the drain electrode of the third transistor 7, and the gate electrode of the first transistor 5, a source electrode is connected to an enable terminal PEN of the shift register 54, and a drain electrode is connected to an output terminal OUT of the shift register 54.

In the sixth transistor 56, a gate electrode is connected to the second input terminal CKB, a drain electrode is connected to the output terminal OUT, and a source electrode is connected to a second low potential-side power VSS2.

It is noted that the enable signal GEN1 is input from an enable terminal PEN of the even-numbered stage (N-th stage) shift register 54 in the shift register block 52, and the enable signal GEN1B, is input from an enable terminal PEN of the odd-numbered state ((N+1)-th stage) shift register 54.

Then, the enable signal GEN2 is input from an enable terminal PEN of the even-numbered stage (N-th stage) shift register 54 in the shift register block 53, and the enable signal GEN2B is input from an enable terminal PEN of the odd-numbered stage ((N+1)-th stage) shift register 54.

It is noted that, in the present embodiment, the first low potential-side power VSS1 is set to be at the same voltage as low potential of each of the first clock signal GCK1, the second clock signal GCK1B, the first clock signal GCK2, and the second clock signal GCK2B and that the second low potential-side power VSS2 is set to be at the same as low potential of each of the enable signals GEN1, GEN1B, GEN2, and GEN2B.

FIG. 13 is a diagram illustrating an example of a drive timing chart for the shift register 54.

First, the (N−1)-th stage shift register 54 in the preceding stage operates, and thus, the output signal that is output from the second output terminal Z of the (N−1)-th stage shift register 54 is input into the set terminal S of the N-th stage shift register 54 (refer to (1) in FIG. 13).

Then, as illustrated in FIG. 12, because the second transistor 6 that is connected to the set terminal S is of a diode connection, the VC node VC is recharged (refer to (2) in FIG. 13).

Next, in a state where the gate electrode of the first transistor 5 that is illustrated in FIG. 12 is charged, when the first clock signal GCK1 is input into the first input terminal CKA of the N-th stage shift register 54, the VC node VC is boosted by the bootstrap operation, and thus, is at a high potential (refer to (3) in FIG. 13).

Subsequently, as illustrated in FIG. 13, when the VC node VC is voltage-boosted to a sufficiently high voltage, the first clock signal GCK1 is output to the second output terminal Z of the N-th stage shift register 54 (refer to (4) in FIG. 13).

Then, for a duration for which the VC node VC is in the High state, when the PEN signal enters the High state, a PEN signal (a signal that is input from the enable terminal PEN) is output from the output terminal OUT of the shift register 54, more precisely, from a scan signal line that is connected to the shift register 54, via the fifth transistor 55 (refer to A in FIG. 13). On the other hand, when the PEN signal enters the Low state, the scan signal line that is connected to the shift register 54 enters the Low state as well.

Then, on the rising edge of the first clock signal GCK1, an output signal from the second output terminal Z of the N-th stage shift register 54 is pulled down to the Low state (the non-active state) (refer to (5) in FIG. 13).

Thereafter, an output signal from the second output terminal Z of the (N+1)-th stage shift register 54 in the shift register block 2 is input into the reset terminal R of the N-th stage shift register 54, and the VC node VC is lowered to a potential state of the first low potential-side power VSS1 (refer to (6) in FIG. 13).

It is noted that the shift register 54 is also driven in the shift register block 53 in the same manner as described with reference to FIG. 13, and that an illustration of this is omitted.

(a) of FIG. 14 is a diagram illustrating a schematic configuration of the shift register block 52. (b) of FIG. 14 is a diagram illustrating a case where an output signal of which a voltage magnitude and a pulse width are adjusted is output from the output terminal OUT of the shift register 54, more precisely, from the scan signal line that is connected to the shift register 54. (c) of FIG. 14 is a diagram illustrating a case where, due to a skip function, the output signal is not output from the output terminal OUT of the shift register 54, more precisely, from the scan signal line that is connected to the shift register 54.

As illustrated in (a) of FIG. 14, in the shift register block 52, when a first clock signal GCK1 is input from a first input terminal CKA of a shift unit 57 of the N-th stage shift register 54, a second clock signal GCK1B is input, train a second input terminal CKB of the shift unit 57 of the N-th stage shift register 54, a second clock signal GCK1B is input from a first input terminal CKA of a shift unit 57 of the (N+1)-stage shift register 54, and a first clock signal GCK1 is input from a second input terminal CKB of the shift unit 57 of the (N+1)-stage shift register 54.

Then, the enable signal GEN1 is input from an enable terminal PEN of the buffer unit 58 of the even-numbered stage (N-th stage) register 54 in the shift register block 52, and the enable signal GEN1B, is input from an enable terminal PEN of the buffer unit 58 of the odd-numbered stage ((N+1)-th stage) shift register 54.

In Embodiments 1 to 4 described above, the output signal of which the voltage magnitude and the pulse width are adjusted is difficult to output from the output terminal OUT of the shift register, more precisely, from the scan signal line that is connected to the shift register, but in the present embodiment, as illustrated in (b) of FIG. 14, the output signal of which the voltage magnitude and the pulse width are adjusted can be output from the output terminal OUT of the shift register 54, more precisely, from the scan signal line that is connected to the shift register 54.

At this time, in a case where the first clock signal GCK1 and the second clock signal GCK1B is caused to operate at a constant voltage and an operation margin of the shift unit 57 is sufficiently secured and then where the enable signal GEN1 or GEN1B is set to be a High voltage Vckh and a Low voltage Vckl of the first clock signal GCK1, a High voltage Vgh and a Low voltage Vgl of the output signal that is output from the output terminal OUT of the shift register 54, more precisely, from the scan signal line which is connected to the shift register 54 satisfies Vtkl≤High voltage (Vgh)≤Vckh and Vckl≤Low voltage Vgl≤Vckh, respectively, via the fifth transistor 55, and the driving can be performed in a manner that changes the voltage magnitude of the output signal in this range. It is noted that Low voltage Vgl≤High voltage Vgh.

That is, a voltage VGL of the output signal that is output from the output terminal OUT of the shift register 54, more precisely, from the scan signal line that is connected to the shift register 54 is a voltage VGE of the enable signal GEN1 or GEN1B.

Furthermore, because a pulse width twGE of the enable signal GEN1 or GEN1B can be adjusted in a manner that satisfies 0 μs≤a pulse width≤a pulse width twCK of a clock signal, the output signal of which the pulse width is adjusted can be output from the output terminal OUT of the shift register 54, more precisely, from the scan signal line that is connected to the shift register 54.

Furthermore, as illustrated in FIG. 12, because a load of the scan signal line is not applied to the second output terminal Z of the shift register 54, a rising edge and a falling edge of a pulse signal of the second output terminal Z of the shift register 54 can be driven earlier. Thus, an operation margin of a shift operation can be increased. That is, higher-speed scan is possible, and an advantage is provided in that a moving image is supported and so forth.

Furthermore, as illustrated in (c) of FIG. 14, only the shift operation is performed while the enable signal GEN1 or GEN1B remains set to be off (in the Low state), and thus the output signal is not output from the output terminal OUT of the shift register 54, more precisely, from the scan signal line that is connected to the shift register 54, the scan operation, that skip drive can be performed.

Therefore, in the imaging device that includes the active substrate 51, the skip drive is performed. Thus, it is possible that only reading of a specific area is performed, and higher-speed scan is possible. Furthermore, because the number of times that the scan signal line is driven can be decreased by the skip drive, a decrease in power consumption is possible.

Embodiment 6

Next, Embodiment 6 of the present disclosure will be described with reference to FIGS. 15 to 22. The present embodiment is different from Embodiments 1 to 5 in that two gate drivers, gate driver 61 and 63 that are formed with GDM, are formed on the active substrate 101, and the other constituent elements are the same as those described in Embodiments 1 to 5. For convenience of description, a member that has the same function as the member that is illustrated in the drawings according to Embodiment 1 to 5 is given the same reference character, and a description thereof is omitted.

FIG. 15 is a diagram illustrating a schematic configuration of an imaging device 60 in which two gate drivers, the gate drivers 61 and 63 that are formed with GDM, are provided on the active substrate 101.

The imaging device 60 includes the active substrate 101 and an external drive circuit 66.

The active substrate 101 includes two gate drives, the gate drivers 61 and 63, that are formed with GDM, a plurality of data signal lines, data signal lines DL1 to DLm, a plurality of scan signal lines, scan signal lines GL1 to GLn, and a plurality of (m×n) pixel units PIX (capture image units) that are correspondingly provided at points, respectively, at which the plurality of data signal lines, the data signal lines DL1 to DLm, and the plurality of scan signal lines, the scan signal lines GL1 to GLn intersect.

It is noted that two gate drives, the gate drivers 61 and 63, that are formed with GDM, are connected to both ends, respectively, of a group of the plurality of scan signal lines, the scan signal lines GL1 to GLn.

The TFT elements 114, each of which includes the semiconductor layer, and the gate drivers 61 and 63 that drive the plurality of scan signal lines, the scan signal lines GL1 to GLn, that are connected to the TFT elements 114, respectively, are formed on the same substrate.

It is noted that a shift register circuit 62 is included in the gate driver 61 which is formed with GDM and that a shift register circuit 64 are included in the gate driver 63 which is formed with GDM.

Furthermore, the external drive circuit 66 includes a gate signal drive circuit 67 and a data signal drive circuit 68.

The gate signal drive circuit 67 controls the gate drivers 61 and 63 with various control signals, via the gate signal terminal 140 that is included in the active substrate 101.

The data signal drive circuit 68 performs reading of a signal from the active substrate 101 at a prescribed timing via a data signal reading terminal 65 that is included in the active substrate 101.

It is noted that, in the present embodiment, as an example of a configuration, a case where the number of pixel units PIX is 1344×1280 and the number of data signal lines is 1344=192 channels×7 blocks is described.

FIG. 16 is a diagram illustrating a schematic configuration of the shift register circuit 62.

As illustrated, the shift register circuit 62 on the left side is configured with 8 shift register blocks 70a, 70b, 70c, 70d, 70e, 70f, 70g, and 70h, each of which includes shift registers 69 in a plurality of stages.

It is noted that, although not illustrated, in the same manner, the shift register circuit 64 on the right side is also configured with 8 shift register blocks 70a, 70b, 70c, 70d, 70e, 70f, 70g, and 70h, each of which includes shift registers 69 in a plurality of stages.

Then, two phase block signals, two phase enable signals, and one gate start pulse signal are input into each of the shift register blocks 70a, 70b, 70c, 70d, 70e, 70f, 70g, and 70h.

FIG. 17 is a diagram illustrating a schematic configuration of the shift register block 70a.

As illustrated, an N-th state shift register 69 of the shift register block 70a is connected to the scan signal line GLn, and an (N+1)-th stage shift register 69 of the shift register block 70a is connected to a scan signal line GLn+8.

Then, two phase clocks, GCK1 and GCK1b, and two enable signals, enable signals GEN1 and GEN1B, are input into the shift register block 70a, and in the shift register block 70a, shift registers 69 is configured with a plurality of stages that result from cascade-connecting shift registers 69.

In the shift register block 70a, for example, a Z signal an output signal that is output from a Z terminal) of an (N−1)-th stage shift register 69 is input as an S signal (a set signal that is input into a set terminal S) of the N-th stage shift register 69, and a Z signal (the output signal that is output from the Z terminal) of the (N+1)-th stage shift register 69 is input as an R signal (a reset signal that is input into a reset terminal R) of the N-th stage shift register 69.

It is noted that, in the shift register block 70a, when a first clock signal GCK1 is input from a first input terminal CKA of the N-th stage shift register 69, a second clock signal GCK1B is input from a second input terminal CKB of the N-th stage shift register 69, a second clock signal GCK1B is input from a first input terminal CKA of the (N+1)-stage shift register 69, and a first clock signal GCK1 is input from a second input terminal CKB of the (N+1)-stage shift register 69.

It is noted that, although not illustrated, this is also the same for the shift register blocks 70b, 70c, 70d, 70e, 70f, 70g, and 70h.

FIG. 18 is a diagram illustrating a schematic configuration of the shift register 69.

A first transistor (T1) 71 is an output transistor for outputting an output signal to the second output terminal Z of the shift register 69.

In the first transistor (T1) 71, a drain electrode is connected to the first input terminal CKA, a gate electrode is connected to a node VC (VC), and a source electrode is connected to the second output terminal Z of the shift register 69.

A second transistor (T2a and T2b) 72 has the dual-gate structure, a set terminal S is connected to a gate electrode and a source electrode, and a drain electrode is connected to the node VC (VC).

A third transistor (T3a and T3b) 73 has the dual-gate structure, a gate electrode is connected to the reset terminal R, a source electrode is connected to the first low potential-side power VSS1, and a drain electrode is connected to the node VC (VC).

It is noted that a fifth transistor (T5a and T5b) 75, a sixth transistor (T6) 76, and a seventh transistor (T7) 77 constitute a pull-down circuit of the VC node (VC), and the sixth transistor 76 and the seventh transistor 77 are circuits each of which generates a VR signal (a signal that is output to the VR node (VR)).

When the shift register 69 is not selected, the VX node VX is pre-charged, via the sixth transistor 76, to a voltage that results from decreasing potential of a signal, which is input from the second input terminal CKB of the shift register 69, as much as a threshold voltage of the sixth transistor 76, and the VC node VC is at all times pulled down to a potential level of the first low potential-side power VSS1, by the fifth transistor 75 to which the VR node VR is connected.

Furthermore, because each of the node that is connected to the second output terminal Z of the shift register 69 and the node that is connected to an output terminal GOUT of the shift register 69 is pulled down, the VR node VR is also connected to gate electrodes of a fourth transistor (T4) 74 and a twelfth transistor (T12) 82. Thus, when the shift register 69 is not selected, the node that is connected to the second output terminal Z of the shift register 69 and the node that is connected to the output terminal GOUT of the shift register 69 are at all times pulled down to potential levels of the first low potential-side power VSS1 and the second low potential-side power VSS2, respectively.

The eleventh transistor (T11) 81 is an output transistor for outputting an output signal to the output terminal GOUT of the shift register 69. In the eleventh transistor 81, a drain electrode is connected to the enable terminal PEN, a gate electrode is connected to the node VC (VC), and a source electrode is connected to the output terminal GOUT of the shift register 69.

In the twelfth transistor (T12) 82, the node VR (VR) is connected to a gate electrode, the output terminal GOUT of the shift register 69 is connected to a drain electrode, and the second low potential-side power VSS2 is connected to a source electrode.

The second output terminal Z of the shift register 69 is connected to each of the set terminal S in the next stage and the reset terminal R in a preceding stage.

Furthermore, in the present embodiment, the first low potential-side power VSS1 is set to be at the same voltage as Low potential of a clock signal, and the second low potential-side power VSS2 is set to be at the same voltage as Low potential of each of the enable signal GEN1 and GEN1B.

It is noted that, when the CLR signal is High state, an eighth transistor (T8a and T8b) 78, a ninth transistor (T9) 79, a tenth transistor (T10) 80, and a thirteenth transistor (T13) 83 pull down (initialize) the VC node VC, the second output terminal Z of the shift register 69, the VR node VR, and the output terminal GOUT of the shift register 69, respectively.

FIG. 19 is a diagram illustrating an example of a method of making scanning possible in the imaging device 60.

(a) of FIG. 19 is a diagram in a case where the normal scanning of all scan signal lines in the imaging device 60 is performed. (b) of FIG. 19 illustrates a case where the all scan signal lines in the imaging device 60, two neighboring scan signal lines at a time, are scanned. (c) of FIG. 19 illustrates a case where, among some of the all scan signal lines in the imaging device 60, the high-speed scanning is performed for every eight neighboring scan signal lines or every four neighboring scan signal lines and where, among some of the all scan signal lines in the imaging device 60, the normal scanning is performed for every scan signal line.

FIG. 20 is an example of a timing chart in the case where the normal scanning of all scan signal lines in the imaging device 60 is performed, which is illustrated in (a) of FIG. 19.

Gate start pulse signals GSP1 to GSP8 are sequentially input into the shift register blocks 70a, 70b, 70c, 70d, 70e, 70f, 70g, and 70h, respectively, during a 1H duration, and first clock signals GCK1 to GCK8 and second clock signals GCK1B to GCK8B are sequentially input. Thus, output signals Z1 to Z1280 that are output from the second output terminal Z of each of the shift registers 69 are sequentially selected to enter the High state.

While the output signals Z1 to Z1280 sequentially enter the High state, the enable signals GEN1 to GEN8 and GEN1B to GEN8B are to be High at their respective timings. Thus, the output signal that causes the scan signal lines GL1 to GL1280 sequentially to enter the High state is output.

It is noted that control is performed in such a manner that, while the first clock signals GCK1 to GCK8 and the second clock signals GCK1B to GCK8B are input as signals that are reverse in phase, the enable signals GEN1 to GEN8 and GEN1B to GEN8B enter the High state at the same time.

As described above, in the imaging device 60, the reading of all the pixel units PIX can be performed.

FIG. 21 is an example of a timing chart in a case where the high-speed scanning is performed for every two neighboring scan signal lines, among all scan signal lines in the imaging device 60 that is illustrated in (b) of FIG. 19.

As illustrated, input clock signals that are input into the shift register blocks 70a, 70b, 70c, 70d, 70e, 70f, 70g, and 70h, respectively, are synchronized and driven in such a manner that GCK1=GCK2, GCK1B=GCK2B, GCK3=GCK4, GCK3B=CGK4B, GCK5=GCK6, GCK5B=GCK6B, GCK7=GCK8, and GCK7B=GCK8B, and thus, it is possible that a selection is made at the same time for every two neighboring scan signal lines. Although an operating frequency of the GCK signal or a length of the 1H duration are the same, because a selection is made for every two scan signal lines, the first vertical duration is shortened to a half, and the operating frequency of the GCK signal is twice as high.

The imaging device 60 is driven in this manner, and thus the resolution is reduced to a half, but it is possible that the frame rate is twice as high.

As described, in the imaging device 60, while scanning is performed for every two scan signal lines, among all scan signal lines, the reading of all the pixel units PIX can be performed.

FIG. 22 is an example of a timing chart in a case where the high-speed scanning is performed for every eight neighboring scan signal lines or every four neighboring scan signal lines, among some of the all scan signal lines in the imaging device 60 and where the normal scanning is performed for every scan signal line, among others of the all scan signal lines in the imaging device 60 that is illustrated in (c) of FIG. 19.

It is noted that, in this case, a portion that is scanned at a high speed on a per-eight lines basis or on a per-four lines basis is not read and that reading of a portion that is normally scanned on a per-one line basis is performed.

Furthermore, as illustrated, for the first clock signals GCK1 to GCK8 and the second clock signals GCK1B to GCK8B, while scanning in progress, a clock drive time changes from the high-speed scanning for every eight lines to the high-speed scanning for every four lines, from the high-speed scanning for every four lines to the normal scanning for every line, and from the normal scanning for every line to the high-speed scanning for every eight lines.

As illustrated, for the portion that is scanned at a high speed on a per-eight lines basis, the input clock signals that are input into the shift register blocks 70a, 70b, 70c, 70d, 70e, 70f, 70g, and 70h, respectively, are synchronized and driven in such a manner that GCK1=GCK2=GCK3=GCK4=GCK5=GCK6=GCK7=GCK8, and GCK1B=GCK2B=GCK3B=GCK4B=GCK5B=GCK6B=GCK7B=GCK8B and thus, it is possible that a selection is made on a per-eight lines basis at the same time.

Furthermore, as illustrated, for the portion (GL617 to 620) that is scanned at a high speed on a per-four lines basis, the input clock signals that are input into the shift register blocks 70a, 70b, 70c, and 70d, respectively, are synchronized and driven in such a manner that GCK1=GCK2=GCK3=GCK4 and GCK1B=GCK2B=GCK3B=GCK4B, and thus, it is possible that a selection is made at the same time for every four neighboring scan signal lines.

It is noted that the normal scanning for every line is described above (refer to FIG. 20) and thus a description thereof is omitted here.

An operation of reading the portion that is scanned at a high speed on a per-eight lines or per-four lines basis is not performed and only the scanning is performed. Furthermore, on this occasion, charge of the pixel unit PIX is released and thus initialization is performed.

On the other hand, an operation of reading the portion that is normally scanned on a per-one line basis is performed in the same manner as in the normal scanning.

As described above, in the imaging device 60, an operation of reading a prescribed area can be performed while performing the high-speed scanning of the prescribed area, and the operation of reading a prescribed area can be performed while performing the normal scanning the prescribed area.

Embodiment 7

Next, Embodiment 7 of the present disclosure will be described with reference to FIG. 23. The present embodiment is different from Embodiments 1 to 6 in that the semiconductor layer which is included on the active substrate is an oxide semiconductor layer, and the other constituent elements are the same as those described in Embodiments 1 to 6. For convenience of description, a member that has the same function as the member that is illustrated in the drawings according to Embodiments 1 to 6 is given the same reference character, and a description thereof is omitted.

The oxide semiconductor layer, for example, is an In—Ga—Zn—O-based semiconductor layer. The oxide semiconductor layer, for example, includes the In—Ga—Zn—O-based semiconductor layer. The In—Ga—Zn—O-based semiconductor layer here is a ternary oxide material that consists of Indium (In), Gallium (Ga), and Zinc (Zn). A ratio (a composition ratio) among In, Ga, and Zn is not particularly limited. Examples of the ratio include In:Ga:Zn=2:2:1, In:Ga:Zn=1:1:1, In:Ga:Zn=1:1:2, and the like. In the present embodiment, as an example, a case where the In—Ga—Zn—O-based semiconductor layer contains a ratio of 1:1:1 for In, Ga, and Zn will be described.

FIG. 23 is a diagram illustrating a characteristic of a transistor that includes the In—Ga—Zn—O-based semiconductor layer that is the oxide semiconductor layer.

The transistor that has the In—Ga—Zn—O-based semiconductor layer has high mobility (that is 20 times higher than that in the case of a transistor that has an a-Si semiconductor layer) and low leakage current (an amount of leakage current is less than one thousandth of that in the case of the transistor that has the a-Si semiconductor layer), and thus, is suitably used as a drive transistor that is included in the gate driver or a pixel transistor that is included in the pixel unit PIX.

It is noted that, if the transistor that has the In—Ga—Zn—O-based semiconductor layer is used, it is possible that power consumption by the imaging device is greatly reduced.

Furthermore, the In—Ga—Zn—O-based semiconductor layer may be amorphous, may include a portion that contains a crystalline substance, and may have crystallinity. It is desirable that a crystalline-substance In—Ga—Zn—O-based semiconductor layer is a crystalline-substance in-Ga—Zn—O-based semiconductor layer to whose layer surface a c-axis is positioned roughly vertical. A crystal structure of the In—Ga—Zn—O-based semiconductor layer, for example, is disclosed in Japanese Unexamined Patent Application Publication Nos. 2012-134475.

Furthermore, for the oxide semiconductor layer, any other oxide semiconductor layer may be included instead of the In—Ga—Zn—O-based semiconductor lever. For example, a Zn—O-based semiconductor layer (ZnO), an In—Zn—O-based semiconductor layer (IZO (a registered trademark)), a Zn—Ti—O-based semiconductor layer (ZTO), a Cd—Ge—O-based semiconductor layer, a Cd—Pb—O-based semiconductor layer, an oxide cadmium-(CdO—) based semiconductor layer, a Mg—Zn—O-based semiconductor layer, an In—Sn—Zn—O-based semiconductor layer (for example, $I_2O_3$—$SnO_2$—ZnO), an In—Ga—Sn—O-based semiconductor layer, or the like may be included.

[Wrap-Up]

An active substrate according to Embodiment 1 of the present disclosure is an active substrate that results from forming on the same substrate a plurality of switching elements each of which includes a semiconductor layer, and a drive circuit that drives a plurality of scan signal lines that are connected to the switching elements, respectively, in which the drive circuit includes N (N is equal to or greater than 2) shift register blocks in each of which a plurality of stage-wise shift registers, each of which outputs an output signal to one of the plurality of scan signal lines, are included, in which N shift registers in the same stage in the N shift register blocks are connected to N neighboring scan signal lines, respectively, and in which N shift registers that belong to each of at least one or more same stages, among a plurality of same stages in the N shift register blocks, output output signals in such a manner that two or more neighboring scan signal lines, among the N neighboring scan signal lines, are active at the same time.

With the configuration described above, in the drive circuit, the N shift registers that belong to each of the at least one or more same, stages, among the plurality of same stages, in the N shift register blocks, output the output signals in such a manner that two or more neighboring scan signal lines are active at the same time. Because of this, in the case of the active substrate that results from forming on the same substrate the plurality of switching elements each of which includes the semiconductor layer, and the drive circuit that drives the plurality of scan signal lines that are connected to the switching elements, respectively, the active substrate that is capable of performing high-speed scanning for setting specific scan signal lines to be active at the same time can also be realized.

In the active substrate according to Embodiment 1, which is an active embodiment according to Embodiment 2, it is preferable that a clock signal is input into each of the N shift register blocks, that each of the N shift registers in the same stage outputs the output signal based on the clock signal, and that a frequency of a clock signal that is input into each of the N shift register blocks in a case where the output signal is output in such a manner that two or more scan signal lines, among the N neighboring scan signal lines, are active at the same time, is higher than a frequency of a clock signal that is input into each of the N shift register blocks in a case where the output signal is output in such a manner that the N neighboring scan signal lines, one scan signal line at a time, are sequentially active.

With the configuration described above, the high-speed scanning of the scan signal line can be realized.

In the active substrate according to Embodiment 2, which is an active embodiment according to Embodiment 3, the frequency of the clock signal that is input into each of the N shift register blocks may be changed at least one time during the first vertical duration.

With the configuration described above, a scanning speed can be changed.

In the active substrate according to any one of Embodiments 1 to 3, which is as active embodiment according to Embodiment 4, a configuration may be employed in which two or more types of different clock signals are input into each of the N shift register blocks, and in which wiring lines over which the two or more types of different clock signal are supplied to each of the N shift register blocks are electrically separated from each other.

With the configuration described above, the active substrate that is capable of performing the high-speed scanning for setting specific scan signal lines to be active at the same time can be realized.

In the active substrate according to Embodiment 4, which is an active embodiment according to Embodiment 5, a configuration may be employed in which a first clock signal and a second clock signal that are different from each other are input into each of the N shift register blocks, in which the second clock signal and the first clock signal are input into first input terminal and a second input terminal, respectively, of a shift register in a preceding stage in each of the N shift register blocks, and in which the first clock signal and the second clock signal are input into a first input terminal and a second input terminal, respectively, of a shift register in a current stage that is a shift register in a next stage which follows the shift register in the preceding stage.

With the configuration described above, the active substrate that is capable of performing the high-speed scanning for setting specific scan signal lines to be active at the same time can be realized using 2×N clock signals.

In the active substrate according to any one of Embodiments 1 to 5, which is an active embodiment according to Embodiment 6, a configuration may be employed in which the shift register includes first, second, third, and fourth transistors, in which in the first transistor, a drain electrode is connected to a first input terminal of the shift register and a source electrode is connected to an output terminal of the shift register that is connected to any one of the plurality of scan signal lines, in which in the second transistor, a gate electrode and a drain electrode are connected to a set terminal of the shift register and a source electrode is connected to a gate electrode of the first transistor, in which in the third transistor, a gate electrode is connected to a reset terminal of the shift register, a drain electrode is connected to a source electrode of the second transistor and the gate electrode of the first transistor, and a source electrode is connected to a low potential-side power, in which in the fourth transistor, a gate electrode is connected to a second input terminal of the shift register, a drain electrode is connected to the output terminal, and a source electrode is connected to the low potential-side power, in which an output signal of a shift register in a preceding stage is input in the set terminal, and in which one of the first clock signal and the second clock signal that are different from each other is input into the first input terminal and the other of the first clock signal and the second clock signal that are different from each other is input into the second input terminal.

With the configuration described above, using the shift register that includes the first, second, third, and fourth transistors, the active substrate that is capable of performing the high-speed scanning for setting specific scan signal lines to be active at the same time can be realized.

In the active substrate according to Embodiment 6, which is an active embodiment according to Embodiment 7, a configuration may be employed in which an output signal of a shift register in a following stage, which is a shift register in a next stage that follows a shift register in a current stage is input into a reset terminal of the shift register in the current stage in each of the N shift register blocks.

With the configuration described above, the shift register in the current stage in each of the N shift register blocks is reset by the shift register in the following stage.

In the active substrate according to Embodiment 6 or 7, which is an active embodiment according to Embodiment 8, a configuration may be employed in which, during a duration other than a duration during which the output signal is output from the output terminal, the output terminal is connected to the low potential-side power via the fourth transistor.

With the configuration described above, the active substrate in which noise resistance is enhanced can be realized.

In the active substrate according to any one of Embodiment 6 to 8, which is an active embodiment according to Embodiment 9, a configuration may be employed in which, during the duration other than the duration during which the output signal is output from the output terminal, a first node that is connected to the source electrode of the second transistor and a drain electrode of the third transistor, and the gate electrode of the first transistor is connected to the low potential-side power.

With the configuration described above, the active substrate in which the noise resistance is enhanced.

In the active substrate according to any one of Embodiments 6 to 9, which is an active embodiment according to Embodiment 10, a configuration may be employed in which, based on a clear signal, a first node that is connected to the source electrode of the second transistor and a drain electrode of the third transistor, and the gate electrode of the first transistor, and a second node that is connected to the output terminal are connected to the low potential-side power.

With the configuration described above, the shift registers can be initialized collectively. Furthermore, at the earliest time during a scan duration, the clear signal is set to be in a High state, and thus an operation from an initiated state is possible and an operation or an output that is not expected is suppressed.

In the active substrate according to any one of Embodiments 6 to 10, which is an active embodiment according to Embodiment 11, a configuration may be employed in which a capacity element is included between a first node that is connected to the source electrode of the second transistor and a drain electrode of the third transistor, and the gate electrode of the first transistor, and a second node that is connected to the output terminal.

With the configuration described above, because the capacity element operates as a capacity that sharply rises up at the time of a bootstrap operation, sharp rising-up efficiency can increase and a drive force can increase.

Furthermore, when the shift registers are not selected, it is possible that an operation is performed in such a manner that potential of the first node is stabilized and that, with coupling, the clock signal that is input from the first input terminal of the shift registers prevents the first node from floating.

In the active substrate according to any one of Embodiments 6 to 11, which is an active embodiment according to Embodiment 12, a configuration may be employed in which at least one of the second transistor and the third transistor is a transistor that has a dual-gate structure.

With the configuration described above, the active substrate in which resistance is enhanced.

In the active substrate according to any one of Embodiments 1 to 5, which is an active embodiment according to Embodiment 13, a configuration may be employed in which the shift register includes first, second, third, fourth, fifth, and sixth transistors, in which in the first transistor, a drain electrode is connected to a first input terminal of the shift register and a source electrode is connected to a second output terminal of the shift register, in which in the second transistor, a gate electrode and a drain electrode are connected to a set terminal of the shift register and a source electrode is connected to a gate electrode of the first transistor, in which in the third transistor, a gate electrode is connected to a reset terminal of the shift register, a drain electrode is connected to a source electrode of the second transistor and the gate electrode of the first transistor, and a source electrode is connected to a first low potential-side power, in which in the fourth transistor, a gate electrode is connected to a second input terminal of the shift register, a drain electrode is connected to the second output terminal, and a source electrode is connected to the first low potential-side power, in which in the fifth transistor, a gate electrode is connected to a first node that is connected to the source electrode of the second transistor and the drain electrode of the third transistor, and the gate electrode of the first transistor, a source electrode is connected to an enable terminal of the shift register, and a drain electrode is connected to an output terminal of the shift register, in which in the sixth transistor, a gate electrode is connected to the second input terminal, a drain electrode is connected to the output terminal, and a source electrode is connected to a second low potential-side power, in which an output signal from a second output terminal of a shift register in a preceding stage is input into the set terminal, in which an output signal from a second output terminal of a shift register in a following stage is input into the reset terminal, in which an enable signal is input into the enable terminal, and in which one of a first clock signal and a second clock signal that are different from each other is input into the first input terminal and the other of the first clock signal and the second clock signal that are different from each other is input into the second input terminal.

With the configuration described above, using the shift register that includes the first, second, third, fourth, fifth, and sixth transistors, the active substrate that is capable of performing high-speed scanning for setting specific scan signal lines to be active at the same time can be realized.

In the active substrate according to Embodiment 13, which is an active embodiment according to Embodiment 14, a pulse width of as output signal that is output from the output terminal of the shift register may be narrower than pulse widths of the first clock signal and the second clock signal.

With the configuration described above, the active substrate in which the pulse width of the output signal that is output from the output terminal of the shift register is narrower than the pulse widths of the first clock signal and the second clock signal can be realized.

In the active substrate according to Embodiment 13, which is an active embodiment according to Embodiment 15, a voltage magnitude of the output signal that is output from the output terminal of the shift register may be smaller than voltage magnitudes of the first clock signal and the second clock signal.

With the configuration described above, the active substrate in which the voltage magnitude of the output signal that is output from the output terminal of the shift register is smaller than the voltage magnitudes of the first clock signal and the second clock signal can be realized.

In the active substrate according to Embodiment 13, which is an active embodiment according to Embodiment 16, configuration may be employed in which the output signal is output to one or several of the plurality of scan signal lines and in which the output signal is not output to one other of, or several others, of the plurality of scan signal lines.

With the configuration described above, in one or several of the plurality of scan signal lines, only scanning of the output signal can be performed without the output signal being output.

In the active substrate according to any one of Embodiments 1 to 16, which is an active embodiment according to Embodiment 17, the semiconductor layer that is included in each of the plurality of switching elements and the semiconductor layer that is included in the transistor of each of the shift registers may be oxide semiconductor layers.

With the configuration described above, it is possible that power consumption is greatly reduced.

In the active substrate according to Embodiment 17, which is an active embodiment according to Embodiment 18, a configuration may be employed in which the oxide semiconductor layer contains Indium, Gallium, and Zinc.

With the configuration described above, it is possible that the power consumption is greatly reduced.

In the active substrate according to Embodiment 18, which is an active embodiment according to Embodiment 19, at least one portion of the oxide semiconductor layer may contain a crystalline substance.

With the configuration described above, it is possible that the power consumption is greatly reduced.

An imaging device according to Embodiment 20 of the present disclosure, which includes the active substrate according to any one of Embodiments 1 to 19 and a reading circuit, may employ a configuration in which imaging units each of which includes the switching element and includes a sensor element which causes an electrical signal to occur based on an amount of incident light, are arranged in a matrix form on the active substrate, and in which, when the scan signal line is active, the reading circuit that reads data of an imaging unit which is connected to the scan signal line reads data of the imaging unit that is connected to at least one or several of the plurality of scan signal lines.

With the configuration described above, the imaging device that is capable of reading the data of the imaging unit that is connected to at least one or several of the plurality of scan signal lines can be realized.

SUPPLEMENTARY INFORMATION

The present disclosure is not limited to each of the embodiments described above, and various modifications to the present disclosure are possible within the scope of the present disclosure defined by claims. Embodiments that are implemented by suitably combining technical means that are disclosed according to different embodiments are also included in the technical scope of the present disclosure. Additionally, new technological features can be formed by combining the technical means that are disclosed according to each of the embodiments.

INDUSTRIAL APPLICABILITY

The present disclosure can find application in an imaging device that includes an active substrate that results from forming a drive circuit driving a scan signal line in a monolithic manner on a substrate, and in an imaging device.

REFERENCE SIGNS LIST

1 ACTIVE SUBSTRATE
2 SHIFT REGISTER BLOCK
3 SHIFT REGISTER BLOCK
4 SHIFT REGISTER
5 FIRST TRANSISTOR
6 SECOND TRANSISTOR
7 THIRD TRANSISTOR
8 FOURTH TRANSISTOR
9 FIFTH TRANSISTOR
10 SIXTH TRANSISTOR
11 SEVENTH TRANSISTOR
12 CAPACITY (CAPACITY ELEMENT)
13 EIGHTH TRANSISTOR
14 SHIFT REGISTER
14a SHIFT REGISTER
15 NINTH TRANSISTOR
23 EIGHTH TRANSISTOR (TRANSISTOR THAT HAS DUAL-GATE STRUCTURE)
24 SHIFT REGISTER
SECOND TRANSISTOR (TRANSISTOR THAT HAS DUAL-GATE STRUCTURE)
27 THIRD TRANSISTOR (TRANSISTOR THAT HAS DUAL-GATE STRUCTURE)
29 FIFTH TRANSISTOR (TRANSISTOR THAT HAS DUAL GATE STRUCTURE)
34 SHIFT REGISTER
54 SHIFT REGISTER
55 FIFTH TRANSISTOR
56 SIXTH TRANSISTOR
57 SHIFT UNIT
58 BUFFER UNIT
60 IMAGING DEVICE

61 GATE DRIVER (DRIVE CIRCUIT)
62 SHIFT REGISTER CIRCUIT
63 GATE DRIVER (DRIVE CIRCUIT)
64 SHIFT REGISTER CIRCUIT
68 DATA SIGNAL DRIVE CIRCUIT (READING CIRCUIT)
69 SHIFT REGISTER
70a to 70h SHIFT REGISTER BLOCK
71 FIRST TRANSISTOR
72 SECOND TRANSISTOR (TRANSISTOR THAT HAS DUAL-GATE STRUCTURE)
73 THIRD TRANSISTOR (TRANSISTOR THAT HAS DUAL-GATE STRUCTURE)
74 FOURTH TRANSISTOR
75 FIFTH TRANSISTOR (TRANSISTOR THAT HAS DUAL-GATE STRUCTURE)
76 SIXTH TRANSISTOR
77 SEVENTH TRANSISTOR
78 EIGHTH TRANSISTOR (TRANSISTOR THAT HAS DUAL-GATE STRUCTURE)
79 NINTH TRANSISTOR
80 TENTH TRANSISTOR
81 ELEVENTH TRANSISTOR
82 TWELFTH TRANSISTOR
83 THIRTEENTH TRANSISTOR
114 TFT ELEMENT (SWITCHING ELEMENT)
115 PHOTO DIODE (SENSOR ELEMENT)
S SENSOR ELEMENT
R RESET ELEMENT
CKA FIRST INPUT TERMINAL
CKB SECOND INPUT TERMINAL
VC VC NODE (FIRST NODE)
OUT OUTPUT TERMINAL
VX VX NODE (SECOND NODE)
VSS LOW POTENTIAL-SIDE POWER
VDD HIGH POTENTIAL-SIDE POWER
CLR CLR SIGNAL (CLEAR SIGNAL)
VSS1 FIRST LOW POTENTIAL-SIDE POWER
VSS2 SECOND LOW POTENTIAL-SIDE POWER
Z SECOND OUTPUT TERMINAL
PEN ENABLE TERMINAL
twCK PULSE WIDTH OF CLOCK SIGNAL
twGE PULSE WIDTH OF ENABLE SIGNAL
VGE VOLTAGE MAGNITUDE OF ENABLE SIGNAL
VGL VOLTAGE MAGNITUDE OF OUTPUT SIGNAL
GLn SCAN SIGNAL LINE
DLm DATA SIGNAL LINE
PIX PIXEL UNIT
GOUT OUTPUT TERMINAL

The invention claimed is:

1. An active substrate that results from forming on the same substrate a plurality of switching elements each of which includes a semiconductor layer, and a drive circuit that drives a plurality of scan signal lines that are connected to the switching elements, respectively,
wherein the drive circuit includes N (N is equal to or greater than 2) shift register blocks in each of which a plurality of stage-wise shift registers, each of which outputs an output signal to one of the plurality of scan signal lines, are included,
wherein N shift registers in the same stage in the N shift register blocks are connected to N neighboring scan signal lines, respectively, and
wherein N shift registers that belong to each of at least one or more same stages, among a plurality of same stages in the N shift register blocks, output output signals in such a manner that two or more neighboring scan signal lines, among the N neighboring scan signal lines, are active at the same time.

2. The active substrate according to claim 1,
wherein a clock signal is input into each of the N shift register blocks,
wherein each of the N shift registers in the same stage outputs the output signal based on the clock signal, and
wherein a frequency of a clock signal that is input into each of the N shift register blocks in a case where the output signal is output in such a manner that two or more scan signal lines, among the N neighboring scan signal lines, are active at the same time, is higher than a frequency of a clock signal that is input into each of the N shift register blocks in a case where the output signal is output in such a manner that the N neighboring scan signal lines, one scan signal line at a time, are sequentially active.

3. The active substrate according to claim 2,
wherein the frequency of the clock signal that is input into each of the N shift register blocks is changed at least one time during a first vertical duration.

4. The active substrate according to claim 1,
wherein two or more types of different clock signals are input into each of the N shift register blocks, and
wherein wiring lines over which the two or more types of different clock signals are supplied to each of the N shift register blocks are electrically separated from each other.

5. The active substrate according to claim 4,
wherein a first clock signal and a second clock signal that are different from each other are input into each of the N shift register blocks,
wherein the second clock signal and the first clock signal are input into a first input terminal and a second input terminal, respectively, of a shift register in a preceding stage in each of the N shift register blocks, and
wherein the first clock signal and the second clock signal are input into a first input terminal and a second input terminal, respectively, of a shift register in a current stage that is a shift register in a next stage which follows the shift register in the preceding stage.

6. The active substrate according to claim 1,
wherein the shift register includes first, second, third, and fourth transistors,
wherein in the first transistor, a drain electrode is connected to a first input terminal of the shift register and a source electrode is connected to an output terminal of the shift register that is connected to any one of the plurality of scan signal lines,
wherein in the second transistor, a gate electrode and a drain electrode are connected to a set terminal of the shift register and a source electrode is connected to a gate electrode of the first transistor,
wherein in the third transistor, a gate electrode is connected to a reset terminal of the shift register, a drain electrode is connected to a source electrode of the second transistor and the gate electrode of the first transistor, and a source electrode is connected to a low potential-side power,
wherein in the fourth transistor, a gate electrode is connected to a second input terminal of the shift register, a drain electrode is connected to the output terminal, and a source electrode is connected to the low potential-side power,
wherein an output signal of a shift register in a preceding stage is input in the set terminal, and wherein one of the first clock signal and the second clock signal that are different from each other is input into the first input terminal and the other of the first clock signal and the second clock signal that are different from each other is input into the second input terminal.

7. The active substrate according to claim 6,
wherein an output signal of a shift register in a following stage, which is a shift register in a next stage that follows a shift register in a current stage is input into a reset terminal of the shift register in the current stage in each of the N shift register blocks.

8. The active substrate according to claim 6,
wherein, during a duration other than a duration during which the output signal is output from the output terminal, the output terminal is connected to the low potential-side power via the fourth transistor.

9. The active substrate according to claim 6,
wherein, during the duration other than the duration during which the output signal is output from the output terminal, a first node that is connected to the source electrode of the second transistor and a drain electrode of the third transistor, and the gate electrode of the first transistor is connected to the low potential-side power.

10. The active substrate according to claim 6,
wherein, based on a clear signal, a first node that is connected to the source electrode of the second transistor and a drain electrode of the third transistor, and the gate electrode of the first transistor, and a second node that is connected to the output terminal are connected to the low potential-side power.

11. The active substrate according to claim 6,
wherein a capacity element is included between a first node that is connected to the source electrode of the second transistor and a drain electrode of the third transistor, and the gate electrode of the first transistor, and a second node that is connected to the output terminal.

12. The active substrate according to claim 6,
wherein at least one of the second transistor and the third transistor is a transistor that has a dual-gate structure.

13. The active substrate according to claim 1,
wherein the shift register includes first, second, third, fourth, fifth, and sixth transistors,
wherein in the first transistor, a drain electrode is connected to a first input terminal of the shift register and a source electrode is connected to a second output terminal of the shift register,
wherein in the second transistor, a gate electrode and a drain electrode are connected to a set terminal of the shift register and a source electrode is connected to a gate electrode of the first transistor,
wherein in the third transistor, a gate electrode is connected to a reset terminal of the shift register, a drain electrode is connected to a source electrode of the second transistor and the gate electrode of the first transistor, and a source electrode is connected to a first low potential-side power,
wherein in the fourth transistor, a gate electrode is connected to a second input terminal of the shift register, a drain electrode is connected to the second output terminal, and a source electrode is connected to the first low potential-side power,
wherein in the fifth transistor, a gate electrode is connected to a first node that is connected to the source electrode of the second transistor and the drain electrode of the third transistor, and the gate electrode of the first transistor, a source electrode is connected to an enable terminal of the shift register, and a drain electrode is connected to an output terminal of the shift register,
wherein in the sixth transistor, a gate electrode is connected to the second input terminal, a drain electrode is connected to the output terminal, and a source electrode is connected to a second low potential-side power,
wherein an output signal from a second output terminal of a shift register in a preceding stage is input into the set terminal,
wherein an output signal from a second output terminal of a shift register in a following stage is input into the reset terminal,
wherein an enable signal is input into the enable terminal, and
wherein one of a first clock signal and a second clock signal that are different from each other is input into the first input terminal and the other of the first clock signal and the second clock signal that are different from each other is input into the second input terminal.

14. The active substrate according to claim 13,
wherein a pulse width of an output signal that is output from the output terminal of the shift register is narrower than pulse widths of the first clock signal and the second clock signal.

15. The active substrate according to claim 13,
wherein a voltage magnitude of the output signal that is output from the output terminal of the shift register is smaller than voltage magnitudes of the first clock signal and the second clock signal.

16. The active substrate according to claim 13,
wherein the output signal is output to one or several of the plurality of scan signal lines, and
wherein the output signal is not output to one other of, or several others, of the plurality of scan signal lines.

17. The active substrate according to claim 1,
wherein the semiconductor layer that is included in each of the plurality of switching elements and the semiconductor layer that is included in the transistor of each of the shift registers are oxide semiconductor layers.

18. The active substrate according to claim 17,
wherein the oxide semiconductor layer contains Indium, Gallium, and Zinc.

19. The active substrate according to claim 18,
wherein at least one portion of the oxide semiconductor layer contains a crystalline substance.

20. An imaging device comprising:
the active substrate according to claim 1; and
a reading circuit,
wherein imaging units each of which includes the switching element and includes a sensor element which causes an electrical signal to occur based on an amount of incident light, are arranged in a matrix form on the active substrate, and
wherein, when the scan signal line is active, the reading circuit that reads data of an imaging unit which is connected to the scan signal line reads data of the imaging unit that is connected to at least one or several of the plurality of scan signal lines.

* * * * *